United States Patent
Lo et al.

(10) Patent No.: US 11,031,382 B2
(45) Date of Patent: Jun. 8, 2021

(54) PASSIVE ELEMENT, ELECTRONIC DEVICE AND METHOD FOR MANUFACTURING THE SAME

(71) Applicant: Advanced Semiconductor Engineering, Inc., Kaohsiung (TW)

(72) Inventors: Pei-Jen Lo, Kaohsiung (TW); Chien-Han Chiu, Kaohsiung (TW); Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/151,310

(22) Filed: Oct. 3, 2018

(65) Prior Publication Data
US 2020/0111774 A1  Apr. 9, 2020

(51) Int. Cl.
*H01L 27/01* (2006.01)
*H01L 23/00* (2006.01)
*H01L 49/02* (2006.01)

(52) U.S. Cl.
CPC .............. *H01L 27/01* (2013.01); *H01L 24/17* (2013.01); *H01L 28/10* (2013.01)

(58) Field of Classification Search
None
See application file for complete search history.

(56) References Cited

U.S. PATENT DOCUMENTS

| | | | |
|---|---|---|---|
| 6,177,716 B1 * | 1/2001 | Clark | H01L 27/0805 257/249 |
| 2015/0042415 A1 | 2/2015 | Hurwitz et al. | |
| 2015/0187714 A1 | 7/2015 | Bhatkar et al. | |
| 2015/0270220 A1 * | 9/2015 | Moon | H01L 21/0337 257/737 |
| 2017/0373044 A1 * | 12/2017 | Das | H01L 23/5226 |
| 2018/0174981 A1 * | 6/2018 | Lu | H01L 23/13 |

FOREIGN PATENT DOCUMENTS

TW  201526186 A  7/2015

* cited by examiner

*Primary Examiner* — Zandra V Smith
*Assistant Examiner* — Lawrence C Tynes, Jr.
(74) *Attorney, Agent, or Firm* — Foley & Lardner LLP

(57) ABSTRACT

An electronic device includes: a first insulation layer and a first conductive pillar. The first insulation layer has a first surface and a second surface opposite to the first surface, and the first conductive pillar comprises a first portion and a second portion. The first portion of the first conductive pillar is surrounded by the first insulation layer. The second portion of the first conductive pillar is disposed on the first surface of the first insulation layer. A height of the second portion of the first conductive pillar is equal to or greater than 10% of a height of the first portion of the conductive pillar.

17 Claims, 25 Drawing Sheets

US 11,031,382 B2

PASSIVE ELEMENT, ELECTRONIC DEVICE AND METHOD FOR MANUFACTURING THE SAME

TECHNICAL FIELD

The subject application relates generally to an electronic device and a method of manufacturing the same, and more particularly to a passive element and a method of manufacturing the same.

BACKGROUND

A semiconductor device package may include an integrated passive device (IPD), e.g., a capacitor, a resistor, an inductor, or the like. The thickness or height of the IPD may determine the performance (e.g., Q factor, capacitance, inductance, etc.). For example, a three-dimensional inductor may include a number of conductive posts/pillars. Poor uniformity of conductive pillars may adversely affect the performance of the semiconductor device package.

SUMMARY

An embodiment of the subject application is related to an electronic device, comprising: a first insulation layer and a first conductive pillar. The first insulation layer has a first surface and a second surface opposite the first surface, and the first conductive pillar comprises a first portion and a second portion. The first portion of the first conductive pillar is surrounded by the first insulation layer. The second portion of the first conductive pillar is disposed on the first surface of the first insulation layer. The height of the second portion of the first conductive pillar is equal to or greater than 10% of the height of the first portion of the conductive pillar.

Another embodiment of the subject application is related to a passive element, comprising: a number of conductive pillars, a first patterned conductive layer, and a second conductive layer. Each of the number of conductive pillars (105) comprises a first portion and a second portion. The first patterned conductive layer is electrically coupled to the first portions of the number of conductive pillars. The second patterned conductive layer is electrically coupled to the second portions of the number of conductive pillars. The height of the second portions of the conductive pillars is equal to or greater than 10% of the height of the first portions of the conductive pillars (105). The first and second patterned conductive layers are parallel.

A further embodiment of the subject application is related to a method of manufacturing an electronic device, comprising: (1) providing a carrier; (2) providing a first photo resist layer on the carrier, the first photo resist layer having an opening; (3) forming a first conductive pillar through the first photo resist layer. The first conductive pillar has a first portion and a second portion. The first portion of the first conductive pillar is surrounded by the photo resist layer, and the second portion of the first conductive pillar is disposed on the first photo resist layer.

It should be noted that the above descriptions are merely examples of the embodiments of the subject application. The effects of the embodiments of the subject application are not limited to the effects described herein, and may be different from the effects described herein, or may further include any other effect.

It is to be understood that both the foregoing general descriptions and the following detailed description are by example and are intended to provide further explanation of the technology used in the present disclosure.

BRIEF DESCRIPTION OF THE DRAWINGS

The accompanying drawings are included to provide a further understanding of the technology used in the present disclosure, and are incorporated into and constitute a part of this specification. The drawings illustrate embodiments and, together with the specification, serve to explain the principles of the technology used in the present disclosure.

DETAILED DESCRIPTION

Some embodiments of the subject application will be described in detail below referring to the accompanying drawings.

Figure 1:
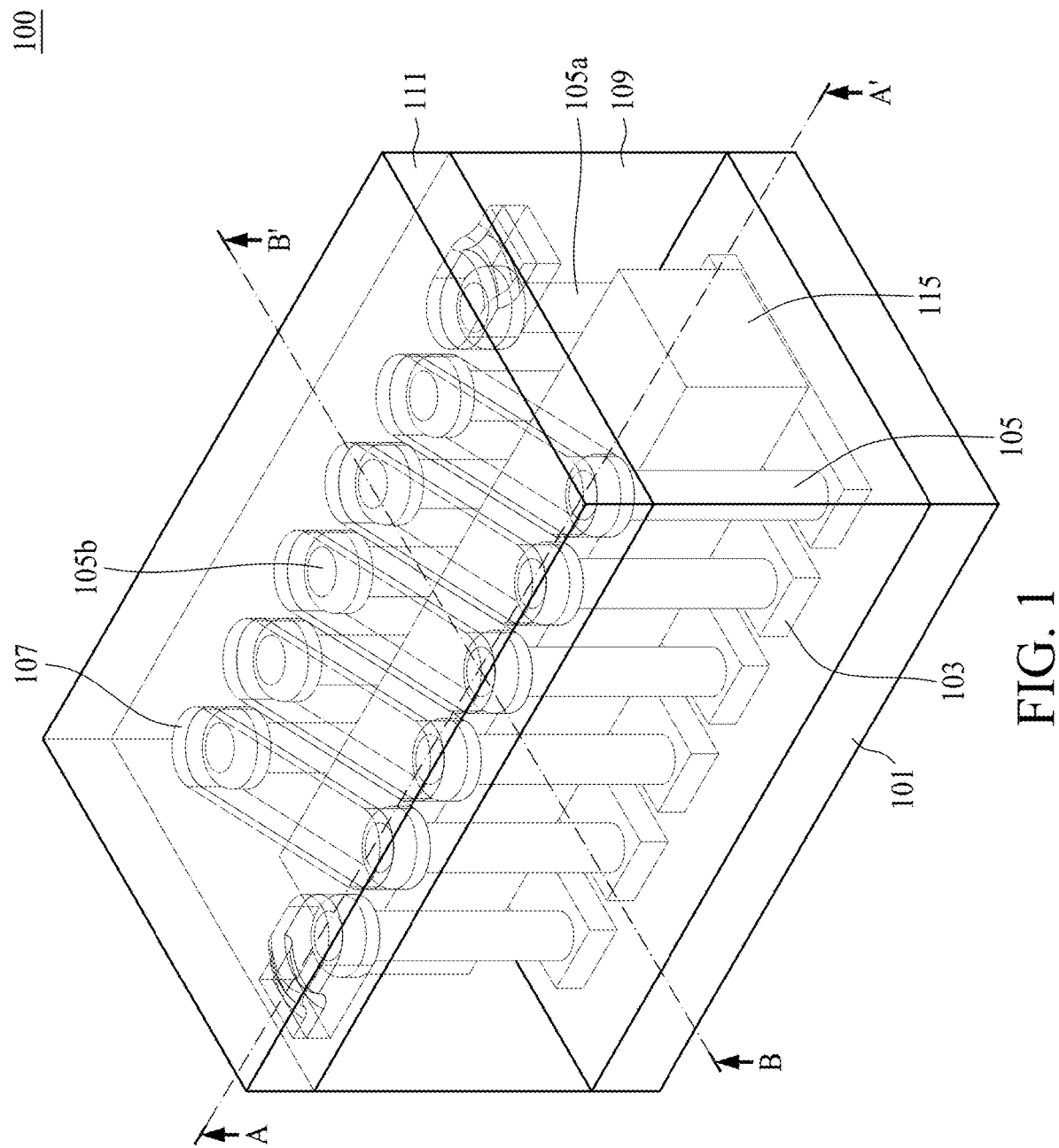
FIG. 1 illustrates a perspective view of an electronic device according to some embodiments of the subject application.

Referring to FIG. 1, a perspective view of an electronic device 100 according to some embodiments of the subject application is illustrated. The electronic device 100 includes a carrier 101, patterned conductive layers 103 and 107, conductive pillars 105, and insulation layers 109 and 111. In some embodiments of the subject application, a bar of magnetic material 115 is between the conductive pillars 105 and is disposed within or surrounded by the insulation layer 109 along the direction of line AA'. The patterned conductive layers 103 and 107 and the conductive pillars 105 are electrically connected and are carried by the carrier 101. Each conductive pillar 105 comprises portions 105a and 105b. The insulation layer 109 comprises surfaces 109a and 109b. The patterned conductive layers 103 and 107 and the conductive pillars 105 form coils and work as a passive element (e.g., an inductor).

Figure 2:
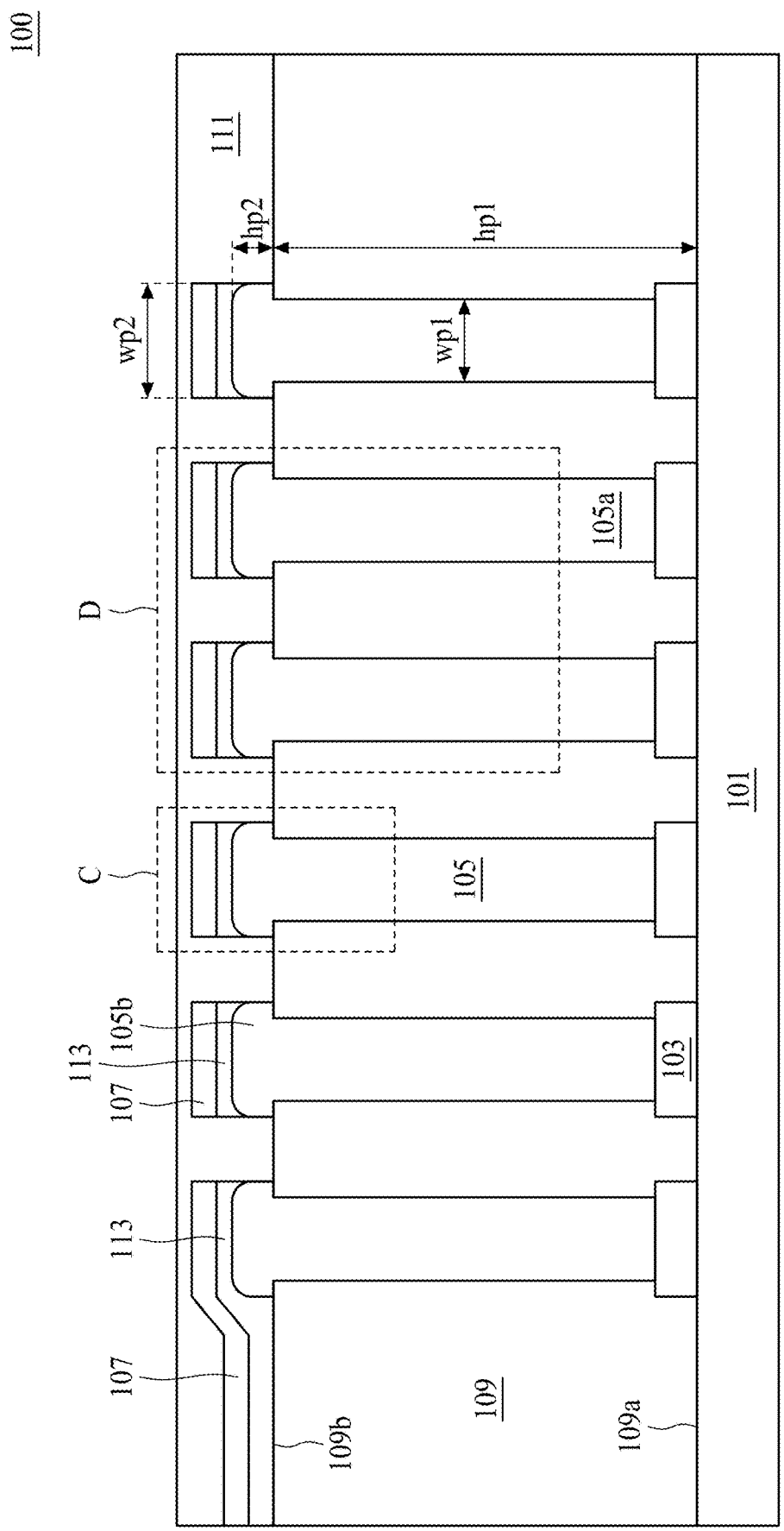
FIG. 2 illustrates a cross-sectional view of an electronic device along line AA' in FIG. 1 according to some embodiments of the subject application.

FIG. 2 illustrates a cross-sectional view of the electronic device 100 along line AA' as shown in FIG. 1 according to some embodiments of the subject application. The portions 105a of the conductive pillars 105 are disposed within or surrounded by the insulation layer 109. The portions 105b of the conductive pillars 105 are disposed on or protruded from the surface 109b of the insulation layer 109. In addition to the elements shown in FIG. 1, FIG. 2 shows a seed layer 113 formed between the portions 105b of the conductive pillars 105 and the patterned conductive layer 107 and between the surface 109b of the insulation layer 109 and the patterned conductive layer 107. In some embodiments, the patterned conductive layer 107 is formed on the portions 105b of the conductive pillars 105 and the surface 109b of the insulation layer 109, and the seed layer 113 is a part of the patterned conductive layer 107. The portions 105a and 105b are integrally formed or formed in one piece. The patterned conductive layer 103 is disposed within or surrounded by the insulation layer 109. The patterned conductive layer 103 and the conductive pillars 105 are integrally formed or formed in one piece. The portion 105a of the conductive pillar 105 has a height hp1 and a width wp1. The portion 105b of the conductive pillar 105 has a height hp2 and a width wp2. In some embodiments, the height hp2 of the portion 105b of the conductive pillar 105 is equal to or greater than 10% of the height hp1 of the portion 105a of the conductive pillar 105. In some embodiments, the height hp1 of the portion 105a is equal to or greater than 140 μm, the thickness of the patterned conductive layer 103 is equal to or greater than 10 μm, and the thickness of the insulation layer 109 is equal to or greater than 150 μm. In some embodiments, there is a difference between the width wp1 of the portion 105a of the conductive pillar 105 and the width wp2 of the portion 105b of the conductive pillar 105. The ratio of the height hp2 to the difference ranges from 1:1.1 to 1:1.3. In some embodiments, the portion 105b of the conductive pillar 105 has a planar top surface.

Among the conductive pillars 105, the portion 105a of one conductive pillar 105 has a first height, and the portion 105a of another conductive pillar 105 has a second height. According to some embodiments, the uniformity of the portions 105a of the conductive pillars 105 is defined as $$\left| \frac{\text{the first height} - \text{the second height}}{\text{the first height} + \text{the second height}} \right| \times 100\%.$$

According to some embodiments, the uniformity of the portions 105a of the conductive pillars 105 is equal to or smaller than 20% and preferably equal to or smaller than 10%. Among the conductive pillars 105, the portion 105a of one conductive pillar 105 has the maximum height compared to all other conductive pillars 105, and the portion 105a of another conductive pillar 105 has the minimum height compared to all other conductive pillars 105. The average height of the portions 105a of the conductive pillars 105 is calculated. According to some embodiments, the uniformity of the portions 105a of the conductive pillars 105 is defined as $$\left| \frac{\text{the maximum height} - \text{the minimum height}}{2 \times \text{the average height}} \right| \times 100\%.$$

According to some embodiments, the uniformity of the portions 105a of the conductive pillars 105 is equal to or smaller than 20% and preferably equal to or smaller than 10%.

Figure 3A:
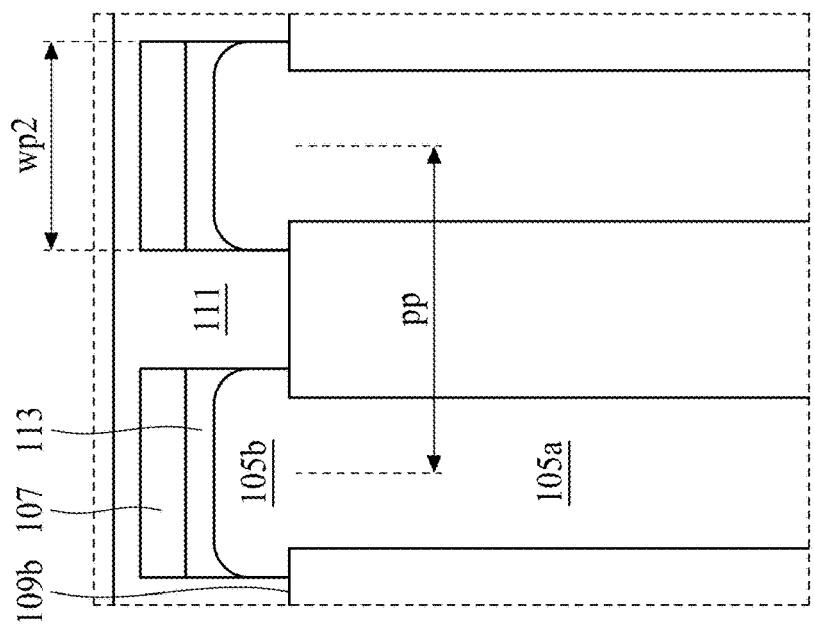
FIG. 3A illustrates a magnified view of the region C shown in FIG. 2 according to some embodiments of the subject application.

FIG. 3A illustrates a magnified view of the region C shown in FIG. 2 according to some embodiments of the subject application. As shown in FIG. 3A, according to some embodiments, the portion 105b of the conductive pillar 105 has a curved surface. According to some embodiments, the surface of the portion 105b of the conductive pillar 105 is a convex surface. According to some embodiments, the cross section of the portion 105b of the conductive pillar 105 is a part of a circle or a part of an ellipse.

Figure 3B:
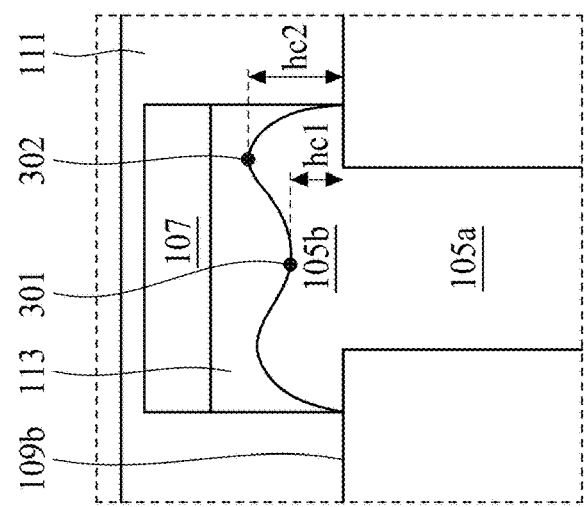
FIG. 3B illustrates a magnified view of the region C shown in FIG. 2 according to some embodiments of the subject application.

FIG. 3B illustrates a magnified view of the region C shown in FIG. 2 according to some embodiments of the subject application. As shown in FIG. 3B, according to some embodiments, the portion 105b of the conductive pillar 105 has a curved surface or a recess. The curved surface of the portion 105b of the conductive pillar 105 comprises points 301 and 302. The point 301 having a minimum height hc1 with respect to the surface 109b of the insulation layer 109, and the point 302 has a maximum height hc2 with respect to the surface 109b of the insulation layer 109. The level of the curve (or recess) of the portion 105b of the conductive pillar 105 is defined as $$\frac{hc2 - hc1}{hc1} \times 100\%.$$

According to some embodiments, the degree of the curve (or recess) of the portion 105b of the conductive pillar 105 is preferably equal to or smaller than 0.5%.

Figure 3C:
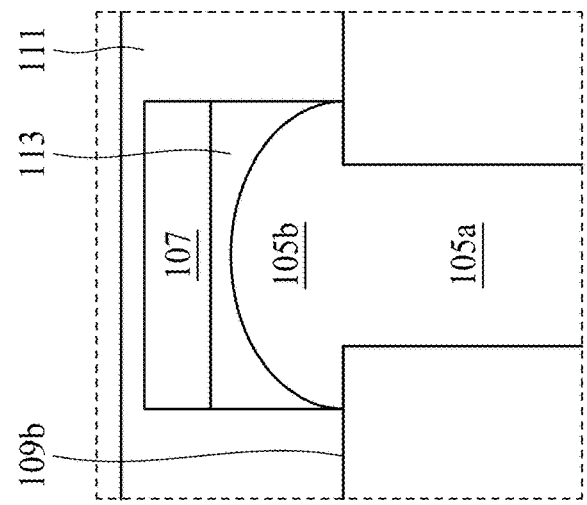
FIG. 3C illustrates a magnified view of the region D shown in FIG. 2 according to some embodiments of the subject application.

FIG. 3C illustrates a magnified view of the region D shown in FIG. 2 according to some embodiments of the subject application. According to some embodiments, a pitch pp between adjacent conductive pillars 105 is equal to or greater than the width wp2 of the portion 105b of the conductive pillar 105. According to some embodiments, the pitch pp between adjacent conductive pillars 105 is the width wp2 of the portion 105b plus a tolerance value of about 3 μm.

Figure 4:
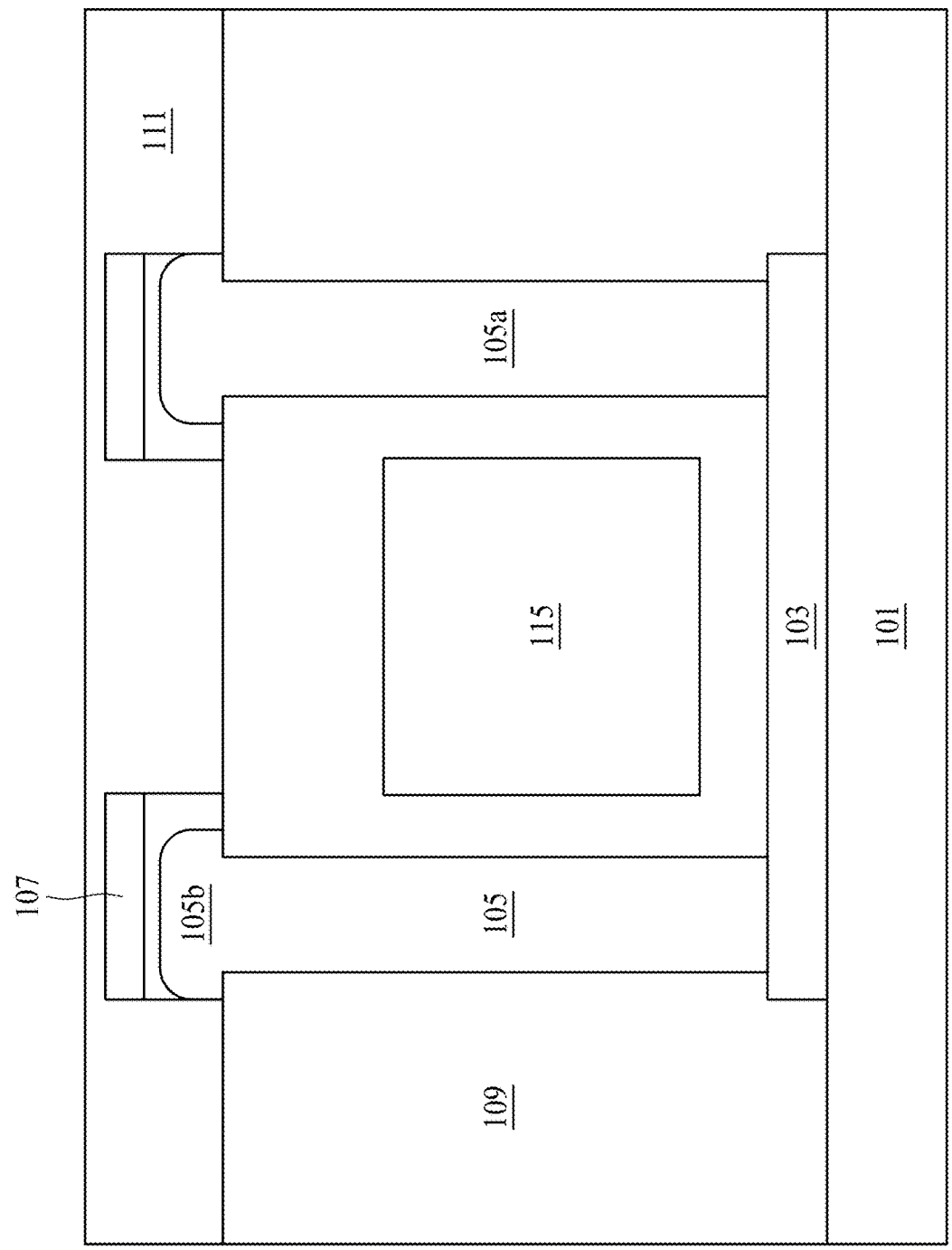
FIG. 4 illustrates a cross-sectional view along line BB' in FIG. 1 according to some embodiments of the subject application.

FIG. 4 illustrates a cross-sectional view of the electronic device 100 along line BB' as shown in FIG. 1 according to some embodiments of the subject application. A bar of magnetic material 115 is between the conductive pillars 105 and is disposed within or surrounded by the insulation layer 109.

Figure 5A:
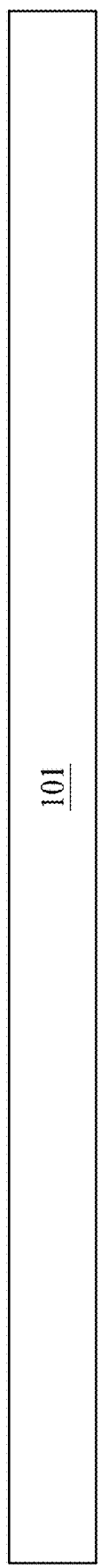
FIG. 5A, FIG. 5B, FIG. 5C, FIG. 5D, FIG. 5E, FIG. 5F, FIG. 5G, FIG. 5H, FIG. 5I, FIG. 5J, and FIG. 5K illustrate perspective views showing the operations for manufacturing an electronic device according to some embodiments of the subject application.
Figure 5B:
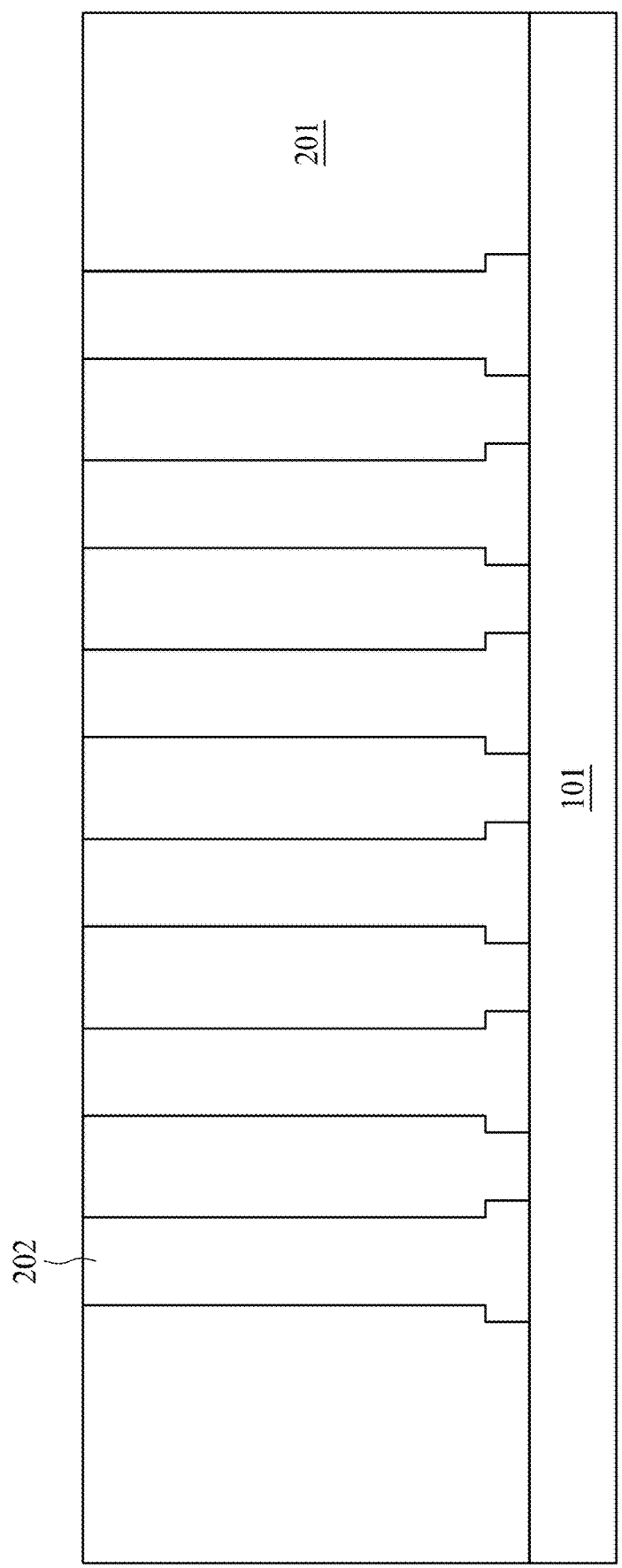
Figure 5C:
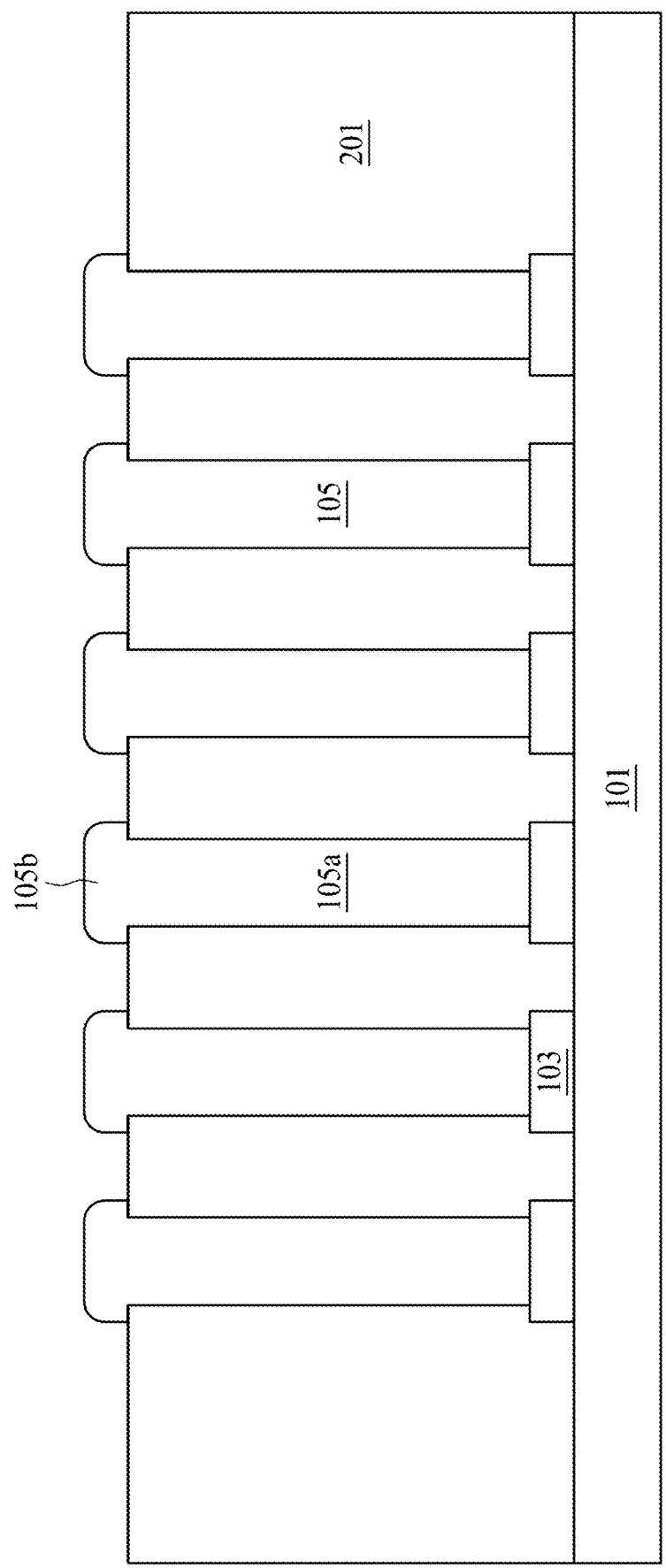

FIGS. 5A to 5K illustrate perspective views showing the operations for manufacturing the electronic device 100 according to some embodiments of the subject application. In FIG. 5A, a carrier 101 is provided. The carrier 101 may be made of silicon or glass. In FIG. 5B, a photo resist layer 201 is provided on the carrier 101, and the photo resist layer 201 is patterned to have openings 202, in which the openings 202 are used to form a patterned conductive layer 103 and conductive pillars 105. In FIG. 5C, the patterned conductive layer 103 and the conductive pillars 105 are formed (e.g., by deposition or electroplating) through the photo resist layer 201. According to some embodiments, the patterned conductive layer 103 and the conductive pillars 105 are integrally formed or formed in one piece. Each conductive pillar 105 comprises portions 105a and 105b. The portion 105a of the conductive pillar 105 is within or surrounded by the photo resist layer 201, and the portion 105b of the conductive pillar 105 is formed or disposed on or the photo resist layer 201 or protruded from the photo resist layer 201. According to some embodiments, the portions 105a and 105b are integrally formed or formed in one piece. The portion 105a of the conductive pillar 105 has a height hp1 and a width wp1 (as shown in FIG. 2). The portion 105b of the conductive pillar 105 has a height hp2 and a width wp2 (as shown in FIG. 2). In some embodiments, the height hp2 of the portion 105b of the conductive pillar 105 is equal to or greater than 10% of the height hp1 of the portion 105a of the conductive pillar 105. In some embodiments, the height hp1 of the portion 105a is equal to or greater than 140 µm, the thickness of the patterned conductive layer 103 is equal to or greater than 10 µm, and the thickness of the photo resist layer 201 is equal to or greater than 150 µm. In some embodiments, there is a difference between the width wp1 of the portion 105a of the conductive pillar 105 and the width wp2 of the portion 105b of the conductive pillar 105. The ratio of the height hp2 to the difference ranges from 1:1.1 to 1:1.3. The height hp1 of the portion 105a of the conductive pillar 105 reaches a specified value (e.g., 140 µm).

Figure 5D:
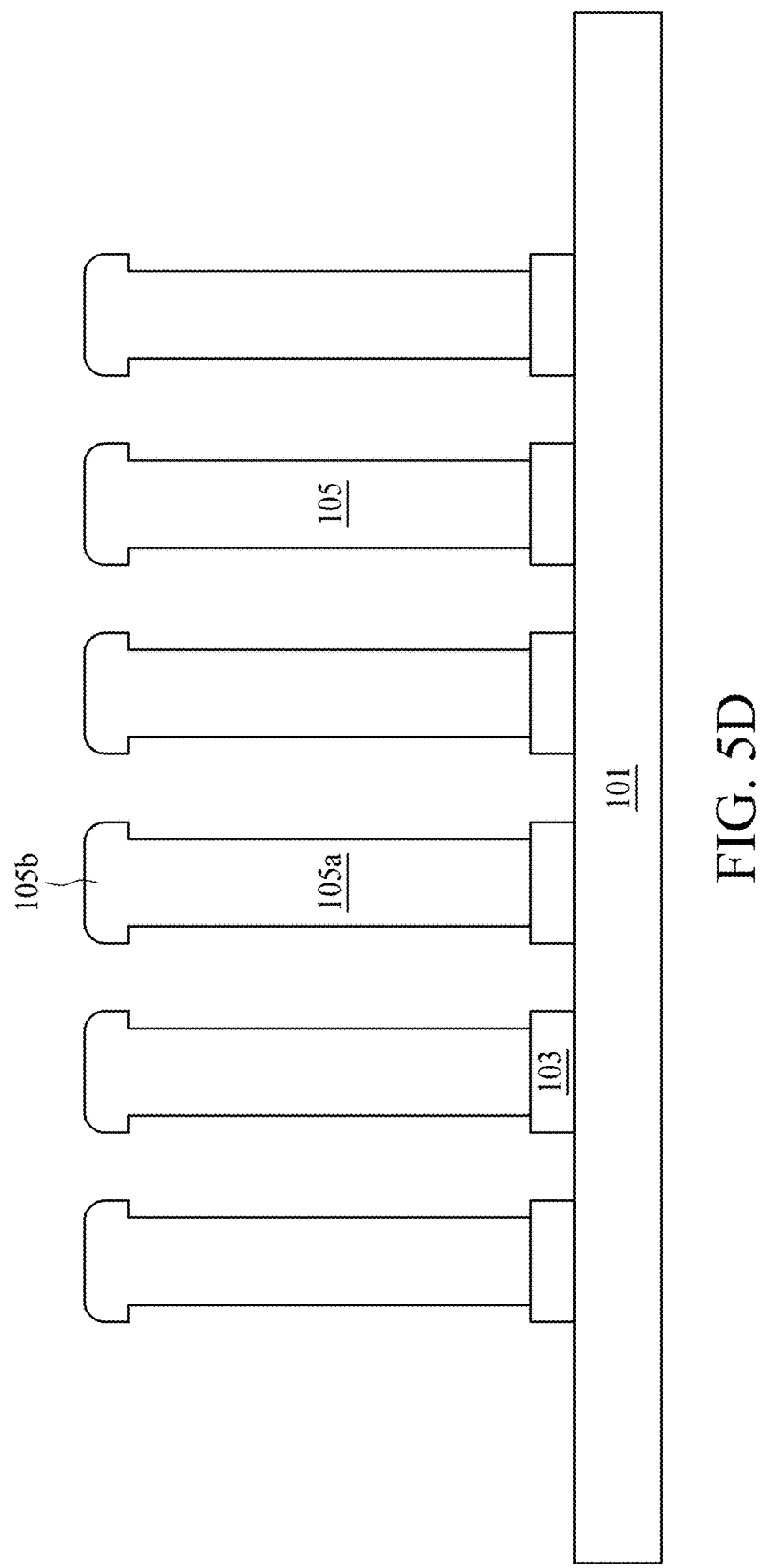
Figure 5E:
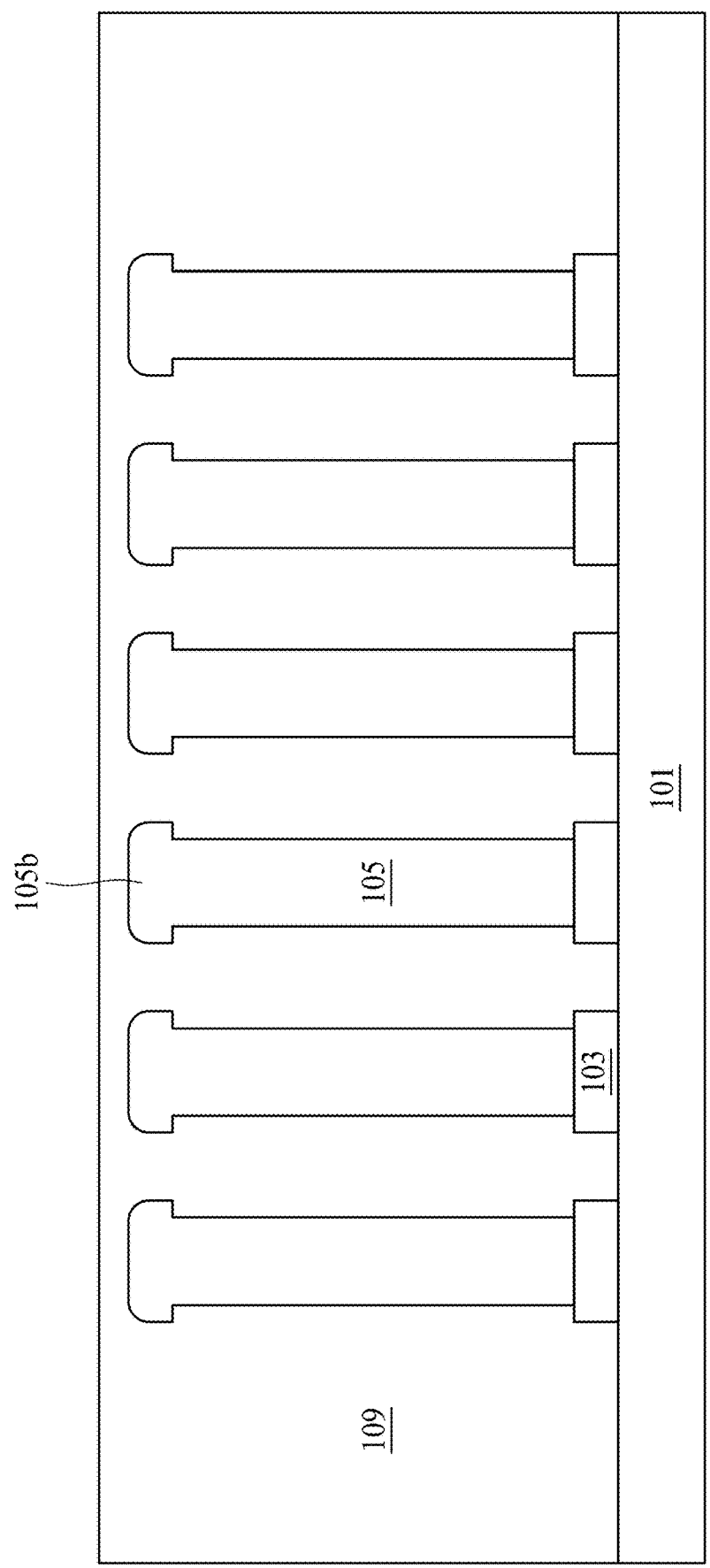
Figure 5F:
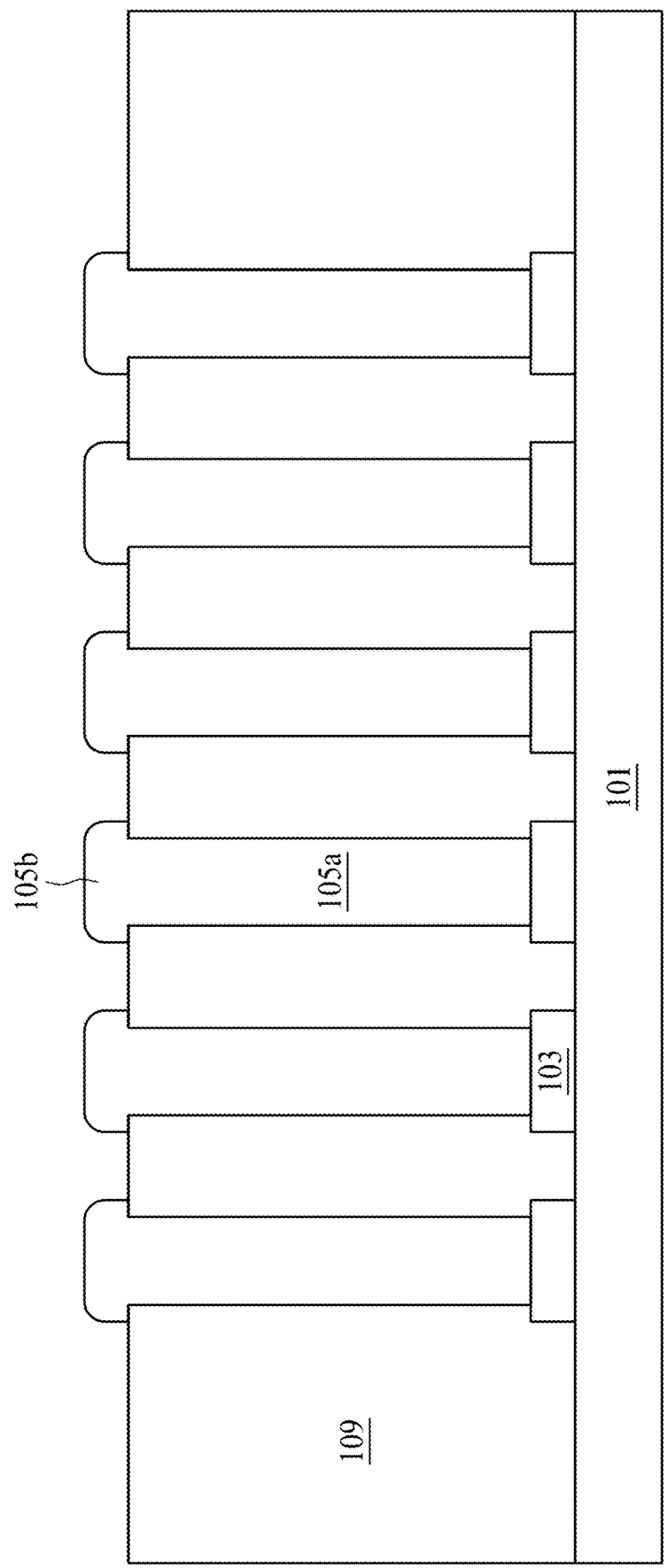
Figure 5G:
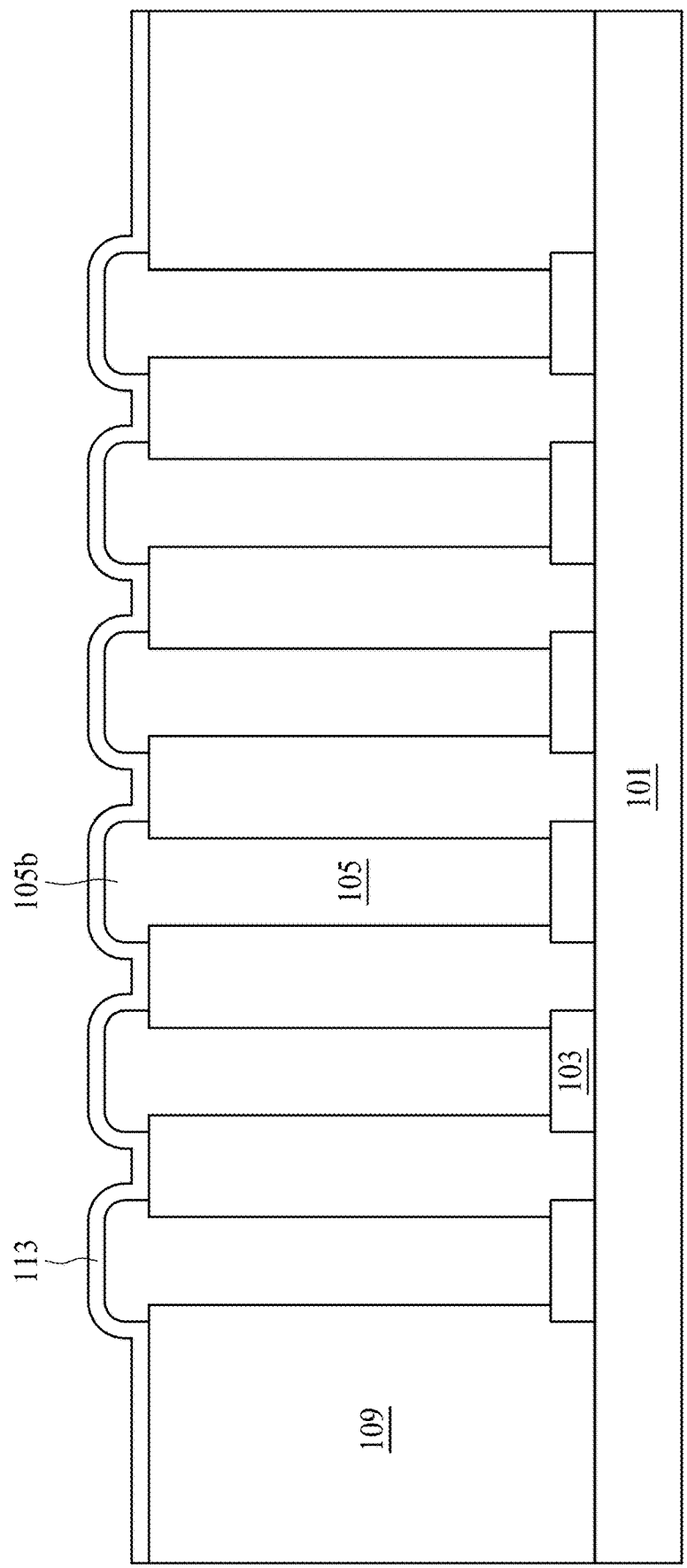
Figure 5H:
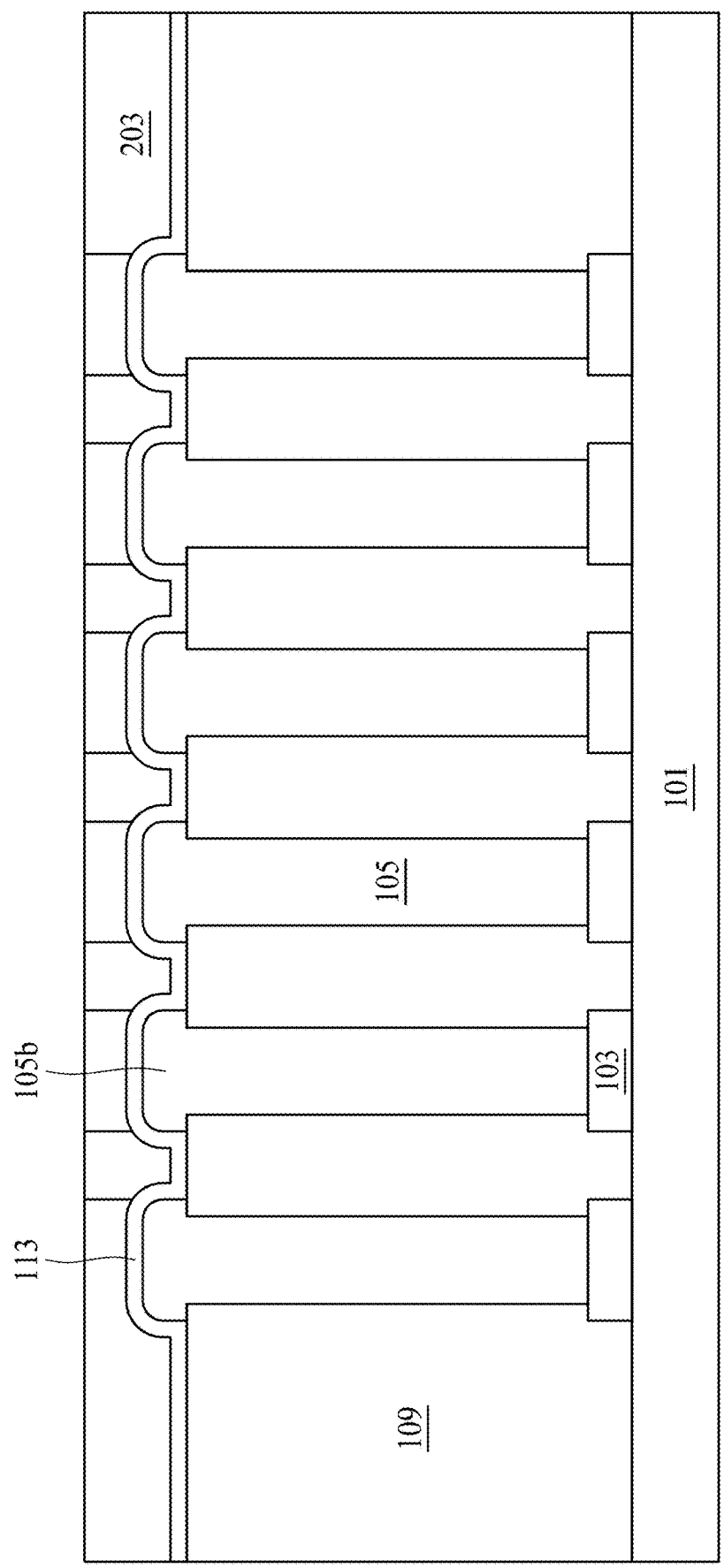
Figure 5I:
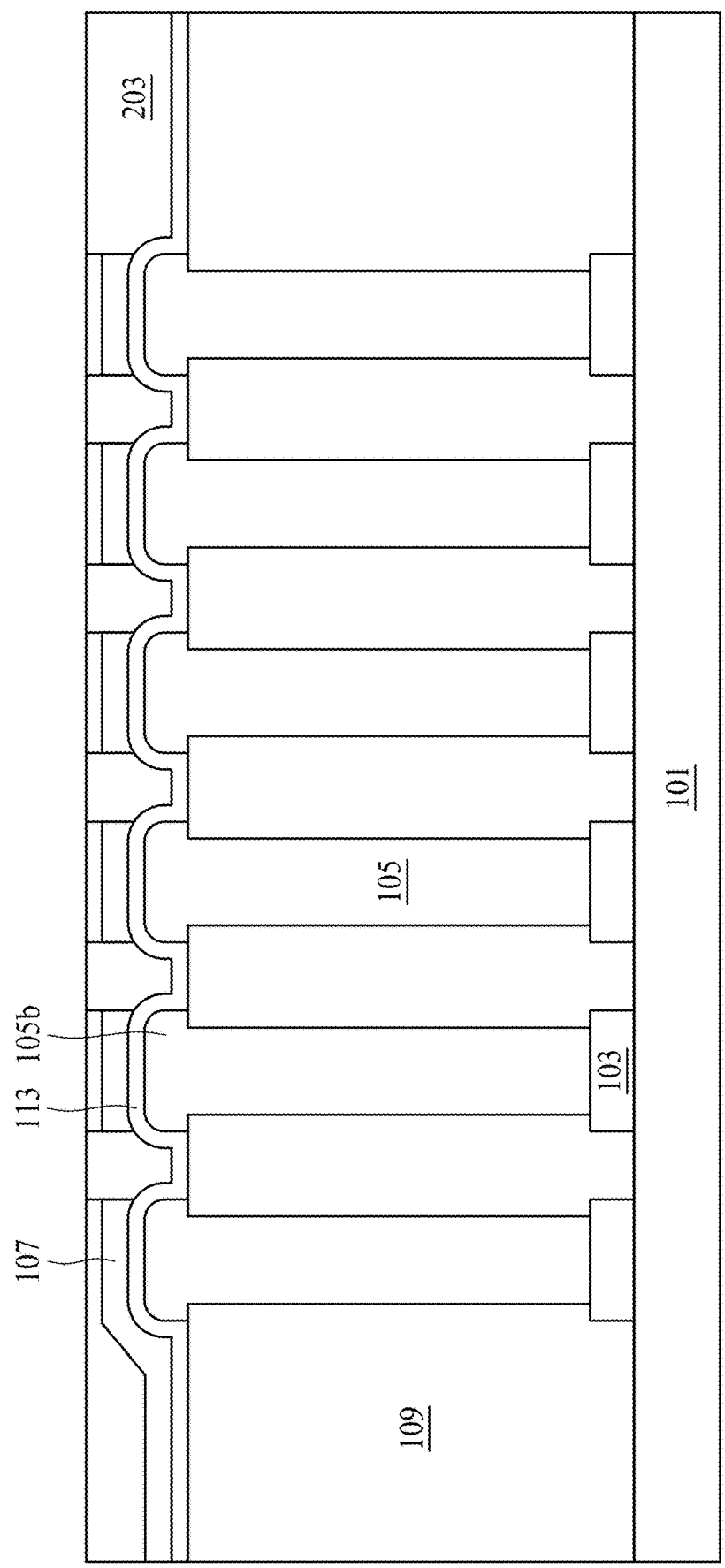
Figure 5J:
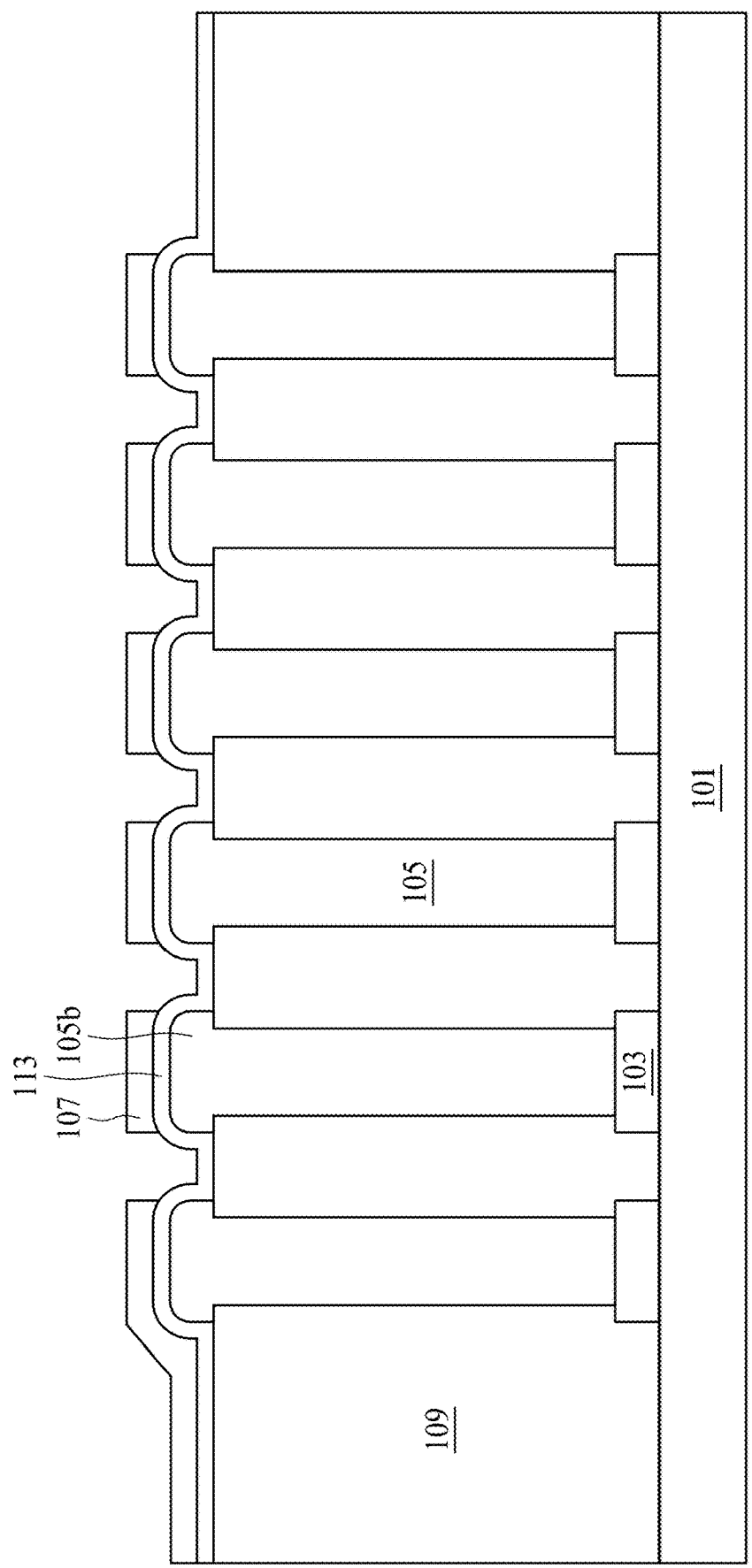
Figure 5K:
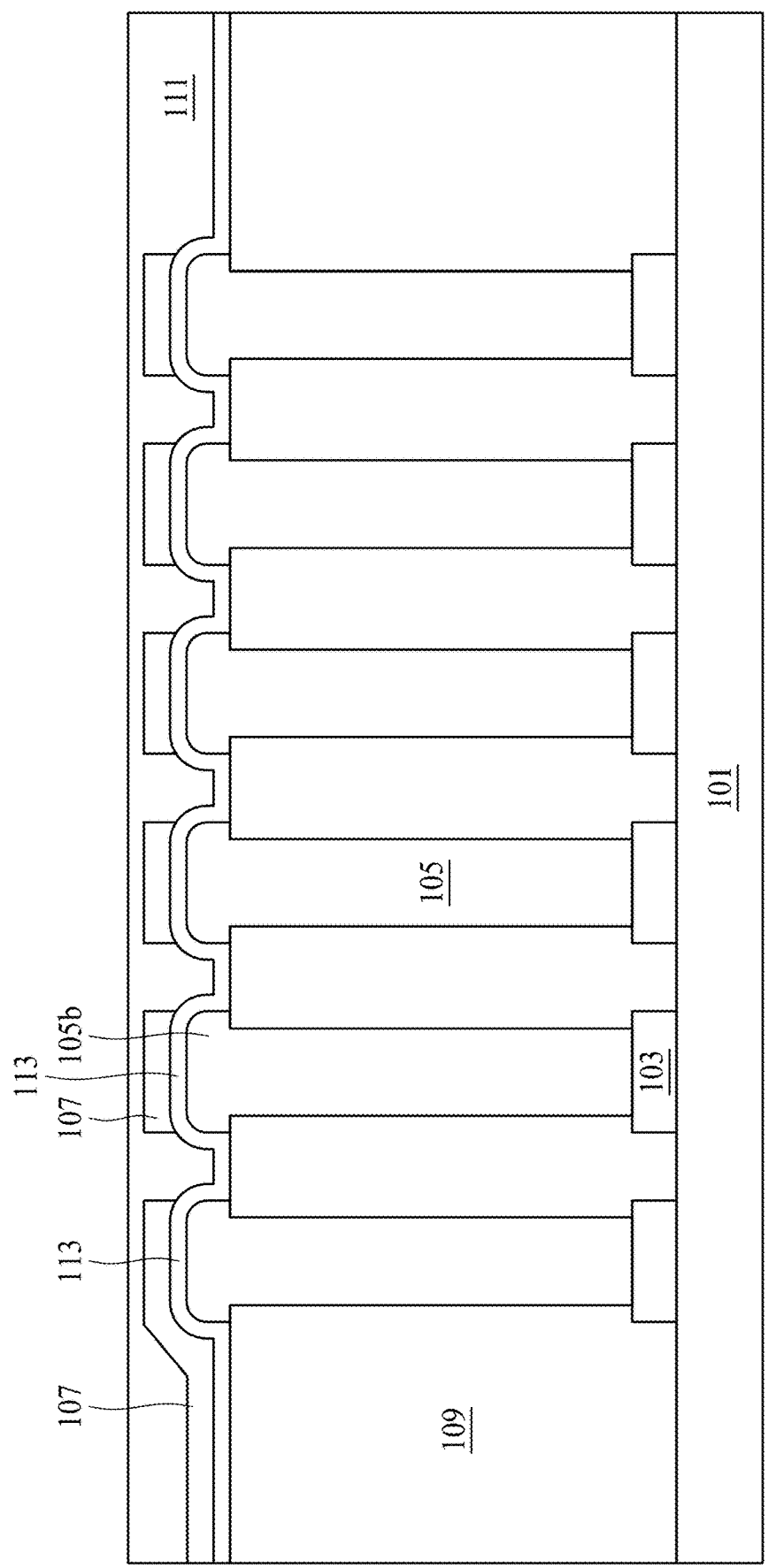

In FIG. 5D, the photo resist 201 is removed (e.g., by etching), and the patterned conductive layer 103 and the conductive pillars 105 (including portions 105a and 105b) are exposed. In FIG. 5E, an insulation layer 109 is formed (e.g., by filling) to encapsulate the patterned conductive layer 103 and the conductive pillars 105 (including portions 105a and 105b). In some embodiments, the insulation layer 109 is formed (e.g., by filling) in two separate operations such that a bar of magnetic material 115 is formed (e.g., by placing, deposition, or electroplating) within (or surrounded by) the insulation layer 109 and between the conductive pillars 105. In FIG. 5F, a portion of the insulation layer 109 is removed (e.g., by dry etching with plasma) such that the portions 105b of the conductive pillars 105 are exposed or protruded from the insulation layer 109. In FIG. 5G, a seed layer 113 is formed (e.g., sputtered or deposited) onto the exposed insulation layer 109 and the portions 105b of the conductive pillars 105. In FIG. 5H, a photo resist layer 203 is provided onto the seed layer 113. The photo resist layer 203 is patterned to have openings that are used to form (e.g., by deposition or electroplating) a patterned conductive layer 107. In FIG. 5I, the patterned conductive layer 107 is formed (e.g., by deposition or electroplating) in the openings of the photo resist layer 203. According to some embodiments, portions of the seed layer 113 are a part of the patterned conductive layer 107. In FIG. 5J, the photo resist layer 203 and the portions of the seed layer 113 under the photo resist layer 203 are removed (e.g., by etching). In FIG. 5K, an insulation layer 111 is formed (e.g., by filling) on the insulation layer 109 and the patterned conductive layer 107 such that the patterned conductive layer 107 is encapsulated.

Figure 6A:
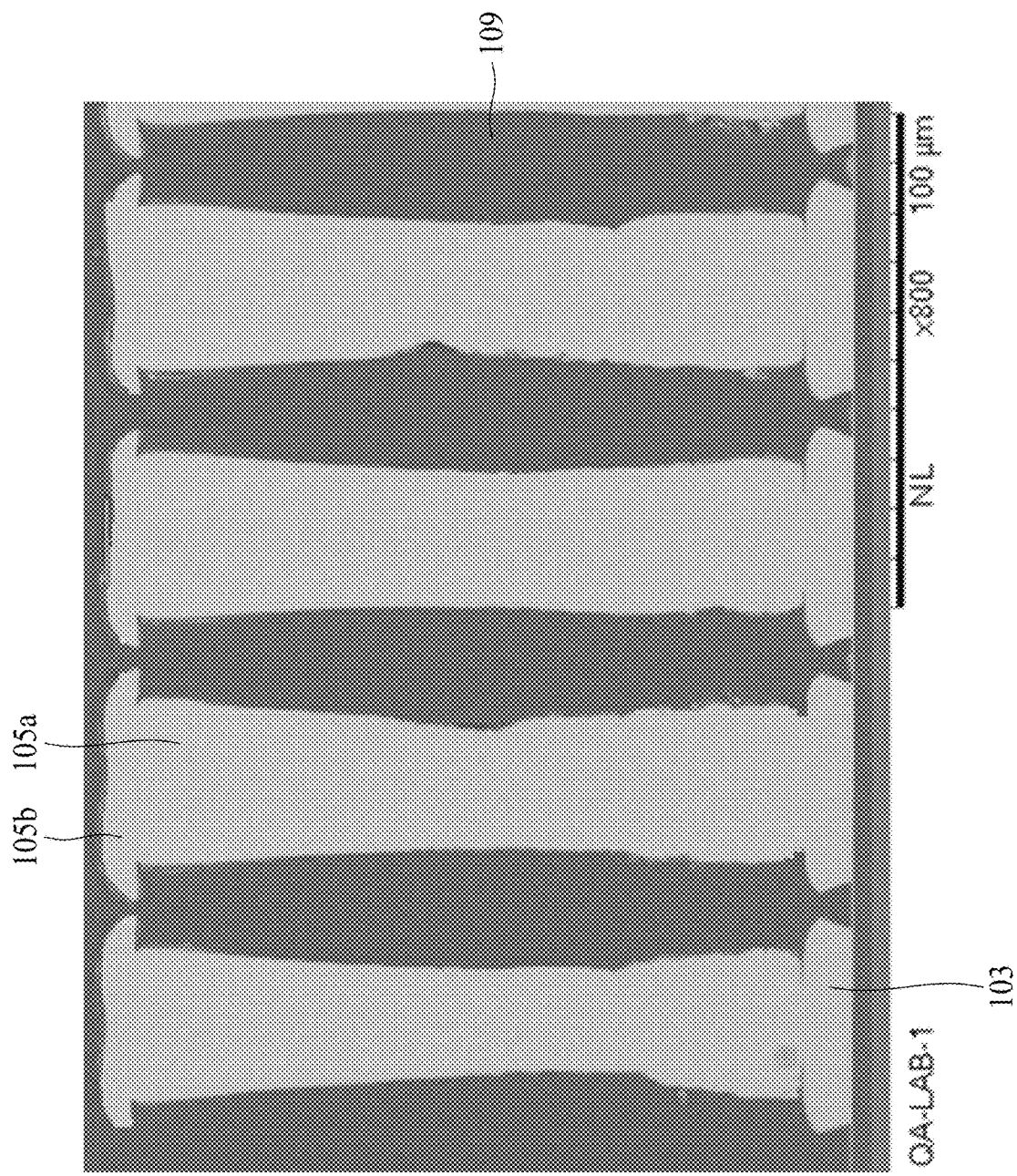
FIG. 6A illustrates a scanning electron microscope (SEM) photo corresponding to a cross-sectional view of the electronic device shown in FIG. 5E according to some embodiments of the subject application.

FIG. 6A illustrates an SEM photo corresponding to a cross-sectional view of the electronic device shown in FIG. 5E according to some embodiments of the subject application. The portions 105b of the conducive pillars 105 are not exposed or protruded from the insulation layer 109. According to some embodiments, the patterned conductive layer 103 and the portions 105a and 105b of the conducive pillars 105 are integrally formed or formed in one piece. As shown in FIG. 6A, the portion 105b of the conductive pillar 105 has a curved surface or a recess. As shown in FIG. 6A, a cross section of the conducive pillars 105 (including the portions 105a and 105b) is a mushroom shape.

Figure 6B:
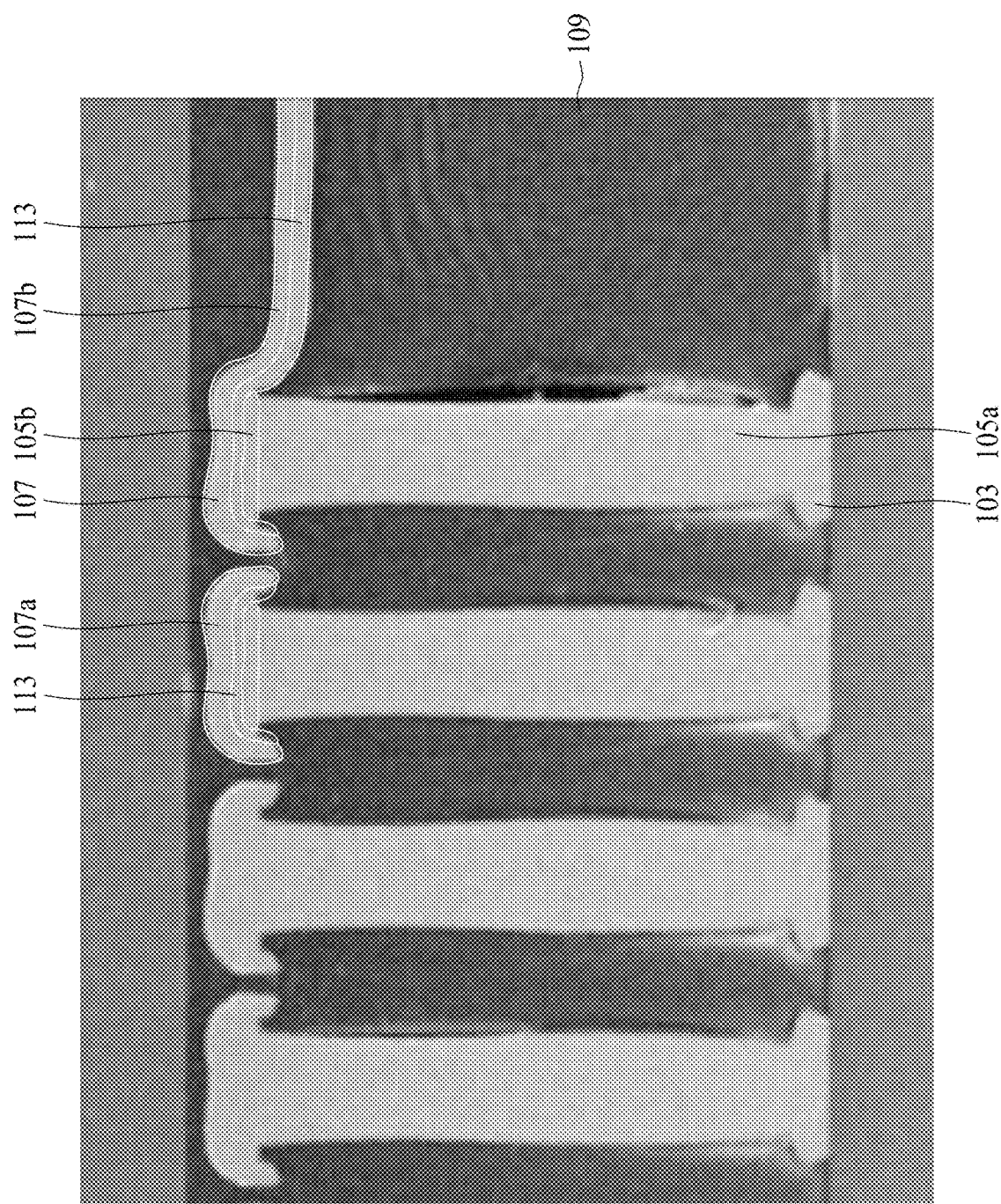
FIG. 6B illustrates an SEM photo corresponding to a cross-sectional view of the electronic device shown in FIG. 5J according to some embodiments of the subject application.

FIG. 6B illustrates an SEM photo corresponding to a cross-sectional view of the electronic device shown in FIG. 5J according to some embodiments of the subject application. The portions 105b of the conducive pillars 105 are protruded from the insulation layer 109, and the patterned conductive layer 107 is formed (e.g., by electroplating or deposition) on the portions 105b of the conductive pillars 105 (e.g., portions 107a) and on the surface of the insulation layer 109 (e.g., a portion 107b). A seed layer 113 is between the portions 105b of the conductive pillars 105 and the patterned conductive layer 107 and between the surface 109b (not shown in FIG. 6B) of the insulation layer 109 and the patterned conductive layer 107. In some embodiments, the seed layer 113 is a part of the patterned conductive layer 107. The patterned conductive layer 107 comprises portions 107a and 107b. The portion 107a of the patterned conductive layer 107 comprises two consecutive curved surfaces and is in a flower shape. The portion 107a of the patterned conductive layer 107 comprises a rim, and a part of the rim of the portion 107a is lower than the top surface of the portion 105b of the conductive pillars 105. The part of the rim of the portion 107a that is lower than the top surface of the portion 105b of the conductive pillars 105 is separated from the conductive pillar 105 by the insulation layer 109. With respect to the rim of the portion 107a, the portion 107a comprises a central part. The central part of the portion 107a of the patterned conductive layer 107 has a curved surface.

Figure 7:
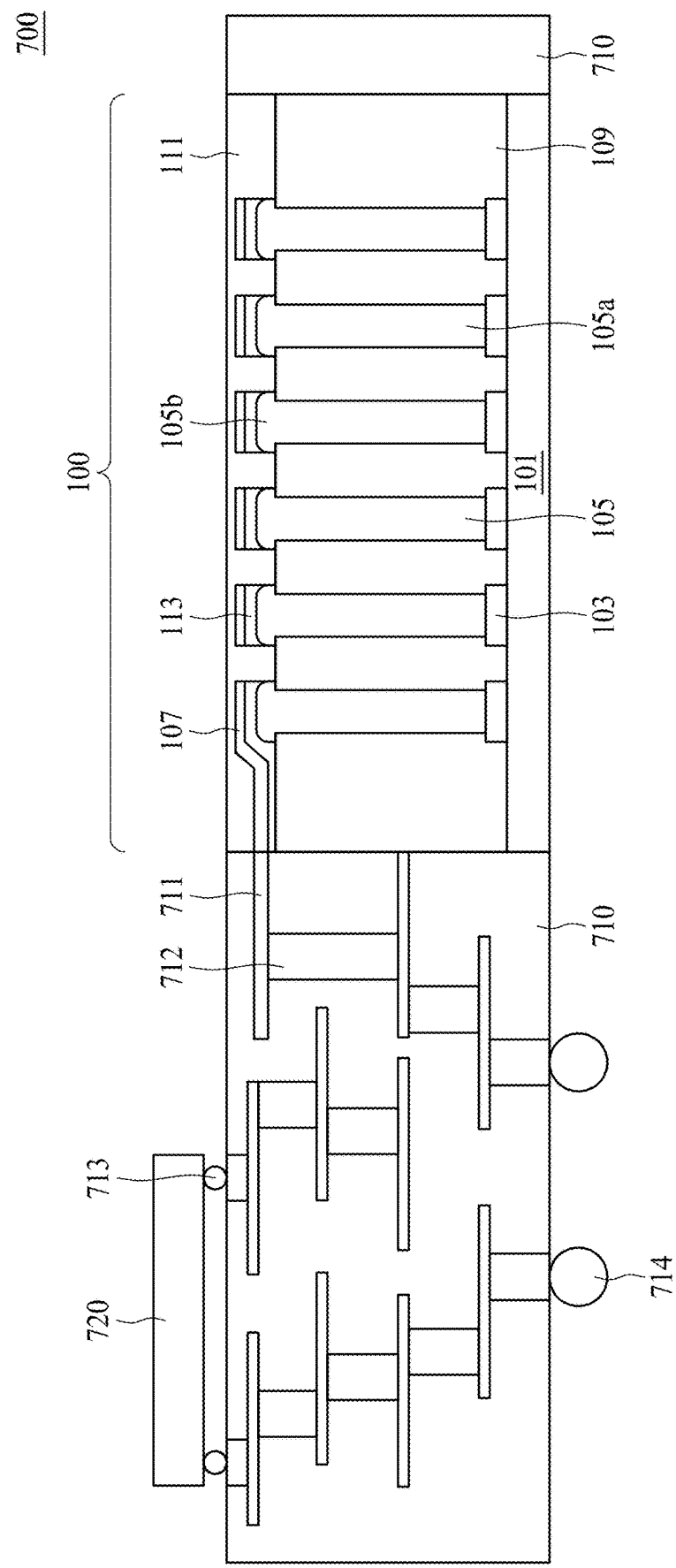
FIG. 7 illustrates a cross-sectional view of a semiconductor device according to some embodiments of the subject application.

FIG. 7 illustrates a cross-sectional view of a semiconductor device 700 according to some embodiments of the subject application. The semiconductor device 700 includes the electronic device 100 shown in FIGS. 1 and 2. The electronic device 100, redistribution layers 711, and vias 712 are provided (e.g., formed) in a substrate 710. Solder balls 714 are provided at the bottom of the semiconductor device 700. A die 720 is electrically coupled to the redistribution layers 711, the vias 712 and the electronic device 100 through solder balls 713.

Figure 8A:
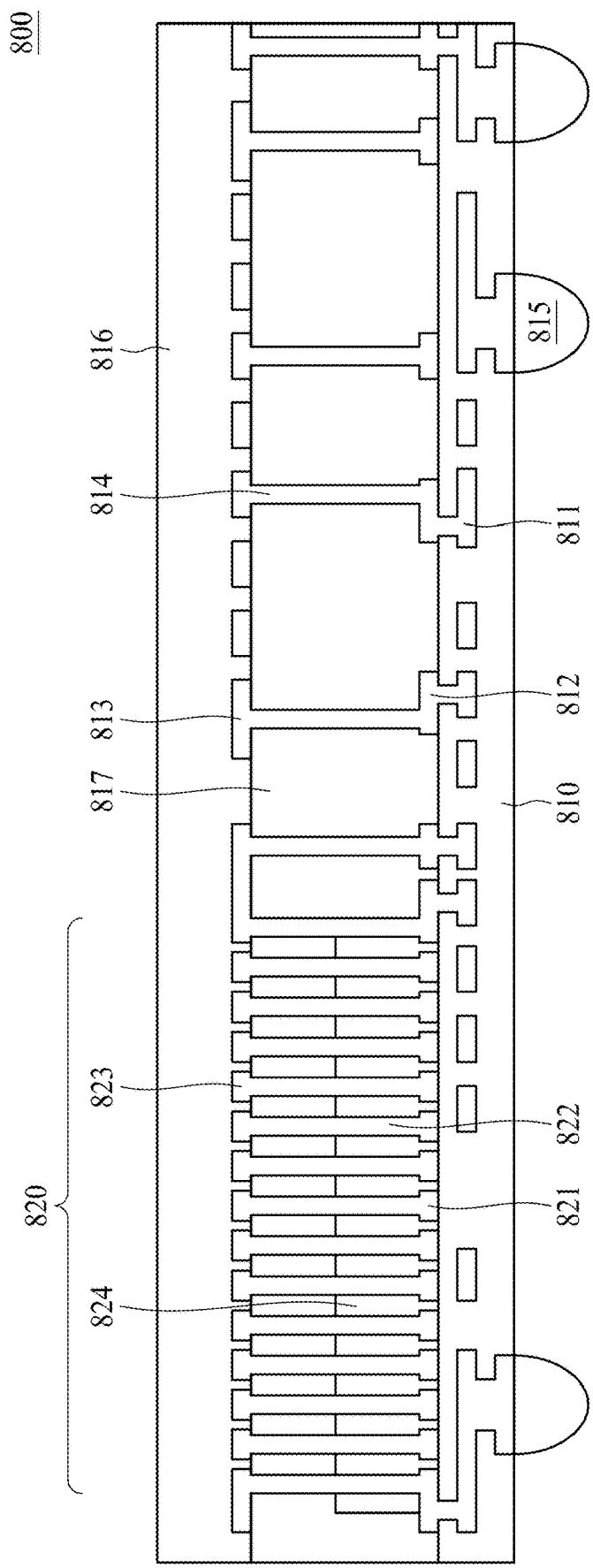
FIG. 8A illustrates a cross-sectional view of a semiconductor device according to some embodiments of the subject application.

FIG. 8A illustrates a cross-sectional view of a semiconductor device 800 according to some embodiments of the subject application. The semiconductor device 800 comprises a substrate 810, redistribution layers 811, 812, and 813, vias 814, solder balls 815, insulation layers 816 and 817, and a passive element 820 (e.g., an inductor). The passive element 820 comprises patterned conductive layers 821 and 823, conductive pillars 822, and a bar of magnetic material 824.

Figure 8B:
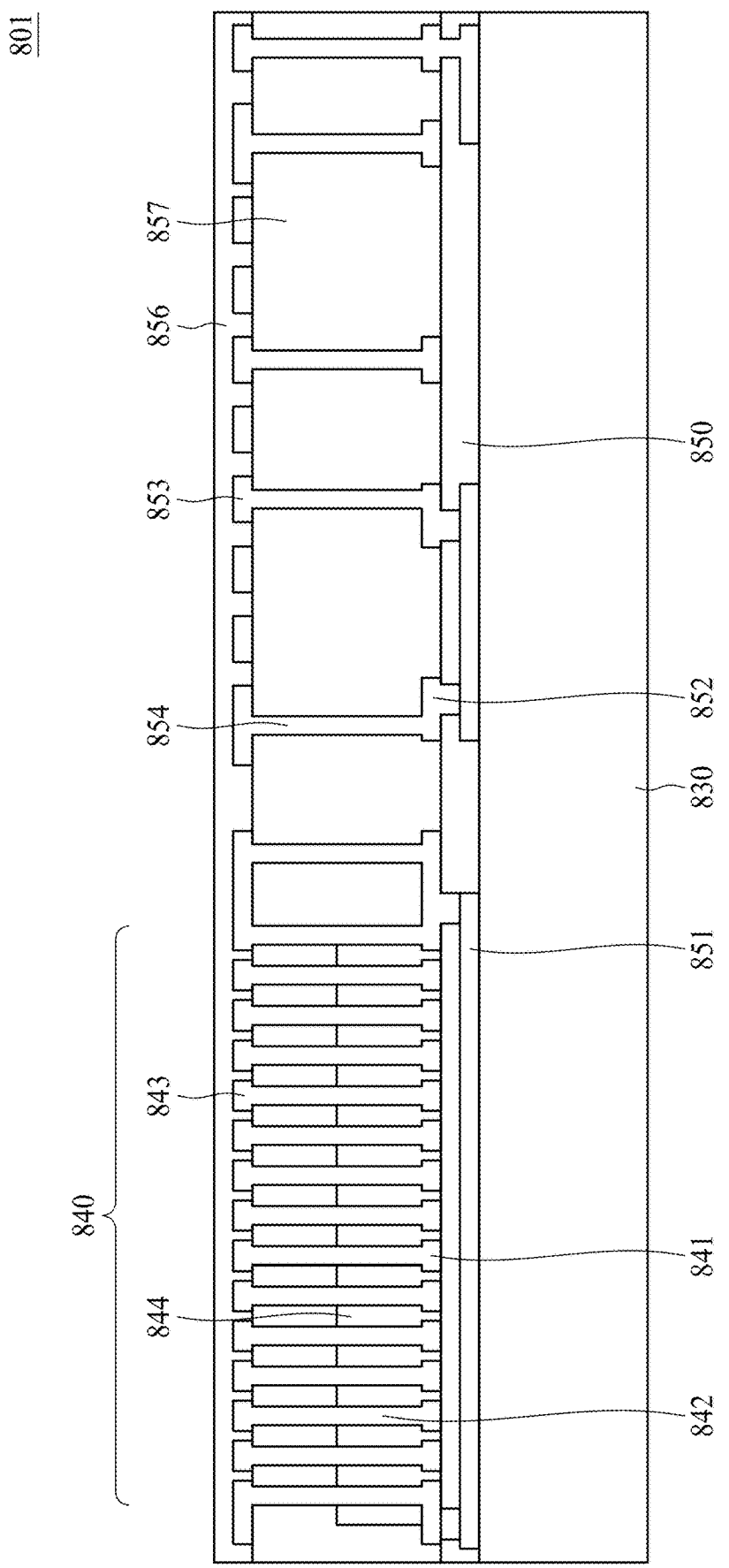
FIG. 8B illustrates a cross-sectional view of a semiconductor device according to some embodiments of the subject application.

FIG. 8B illustrates a cross-sectional view of a semiconductor device 801 according to some embodiments of the subject application. The semiconductor device 801 comprises a glass carrier 830, a substrate 850, redistribution layers 851, 852, and 853, vias 854, insulation layers 856 and 857, and a passive element 840 (e.g., an inductor). The passive element 840 comprises patterned conductive layers 841 and 843, conductive pillars 842, and a bar of magnetic material 844.

Figure 9B:
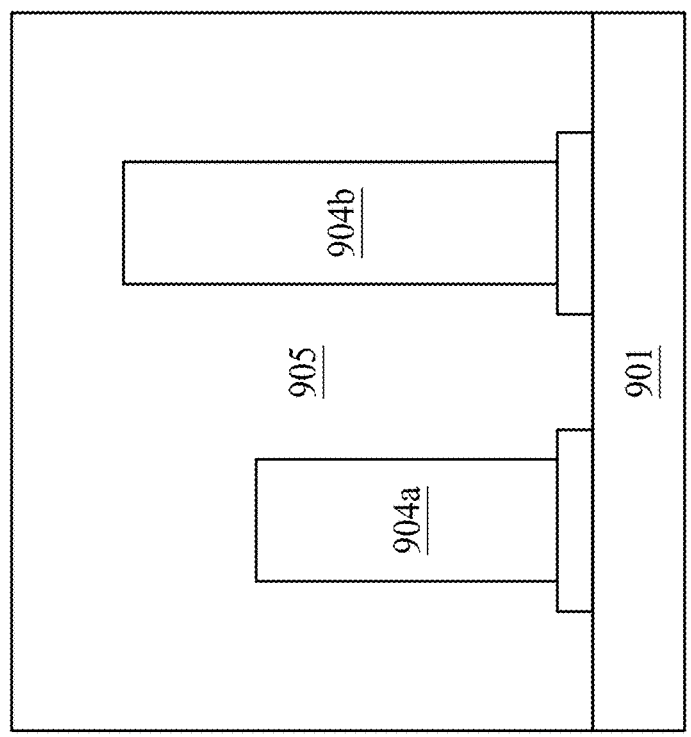
FIG. 9A, FIG. 9B, FIG. 9C, FIG. 9D, FIG. 9E, and FIG. 9F illustrate cross-sectional views showing the operations for forming conductive pillars of the semiconductor device shown in FIG. 8A or 8B according to some embodiments of the subject application.
Figure 9A:
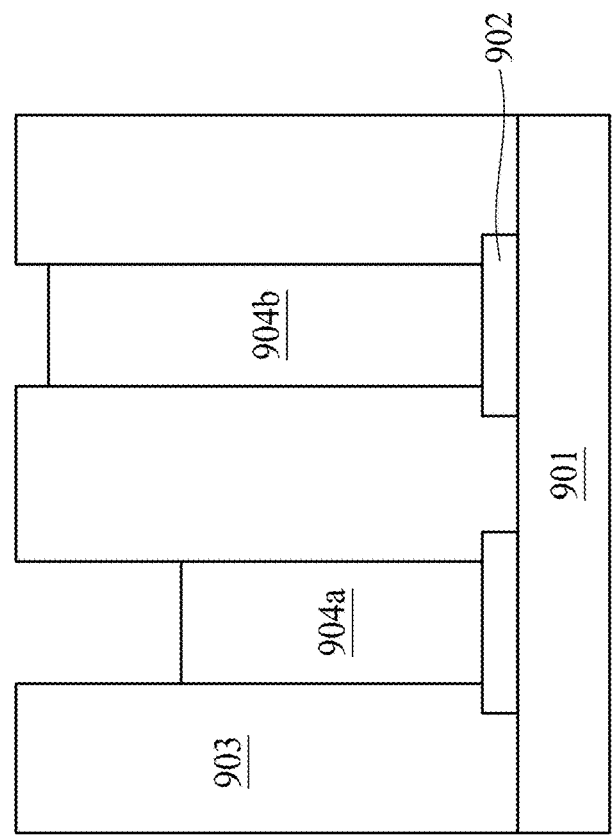

FIGS. 9A to 9F illustrate cross-sectional views showing the operations for forming conductive pillars of the semiconductor device 800 or 801 shown in FIG. 8A or 8B according to some embodiments of the subject application. In particular, FIGS. 9A to 9F illustrate cross-sectional views showing the operations for forming conductive pillars of the passive element 820 or 840 shown in FIG. 8A or 8B according to some embodiments of the subject application. In FIG. 9A, a patterned conductive layer 902 and conductive pillars 904a and 904b are formed (e.g., by electroplating or deposition) on a carrier 901 using a photo resist layer 903. The height of the conductive pillar 904b is greater than that of the conductive pillar 904a. Both conductive pillars 904a and 904b do not reach the height of the photo resist layer 903, so neither of the conductive pillars 904a and 904b reaches the specified height (e.g., 140 μm). In FIG. 9B, the photo resist layer 903 is removed and an insulation layer 905 is formed on the carrier 901 such that the patterned conductive layer 902 and the conductive pillars 904a and 904b are encapsulated.

Figure 9D:
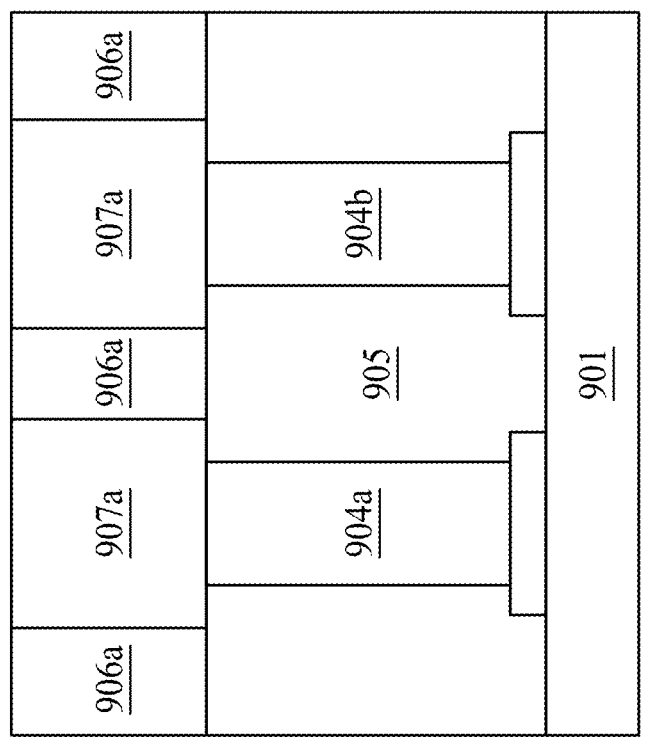
Figure 9C:
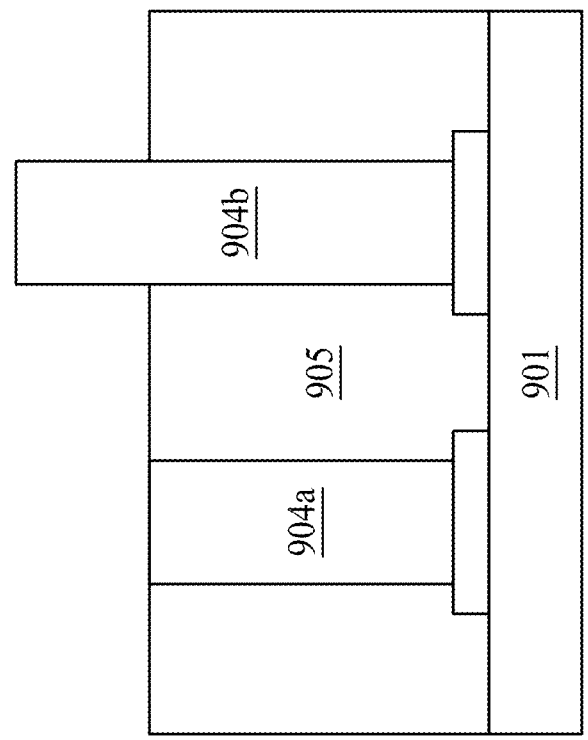

FIGS. 9C and 9D illustrate an embodiment of forming a patterned conductive layer (e.g., 907a) on the conductive pillars 904a and 904b. In FIG. 9C, a portion of the insulation layer 905 is removed (e.g., by plasma etching) to expose the top surface of the short conductive pillar 904a, and the high conductive pillar 904b is also exposed and protruded from the insulation layer 905. In FIG. 9D, a patterned conductive layer 907a is formed (e.g., by electroplating or deposition) using a photo resist layer 906a. In FIG. 9D, both conductive pillars 904a and 904b are electrically coupled to the patterned conductive layer 907a. However, since the heights of the conductive pillars 904a and 904b between two patterned conductive layers 902 and 907a are much smaller than the specified height (e.g., 140 μm), the performance (e.g., inductance, Q value, and direct contact resistance) of the passive element 820 or 840 shown in FIG. 8A or 8B is adversely affected. For example, the inductance and Q value are much smaller than the specified values, and the direct contact resistance is much greater than the specified value.

Figure 9F:
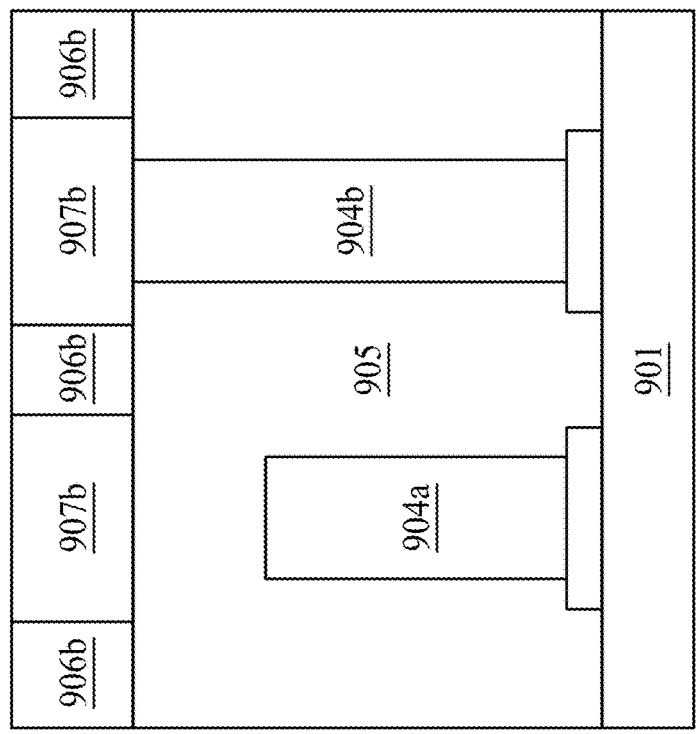
Figure 9E:
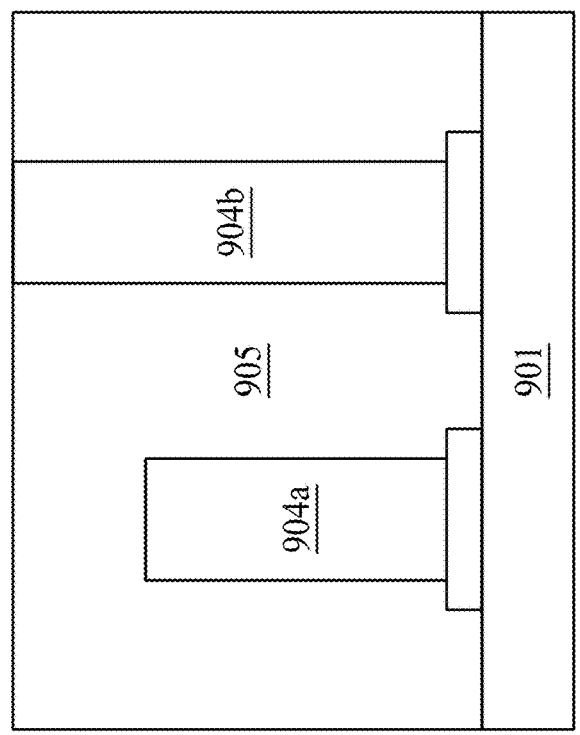

FIGS. 9E and 9F illustrate another embodiment of forming a patterned conductive layer (e.g., 907b) on the conductive pillars 904a and 904b. In FIG. 9E, a portion of the insulation layer 905 is removed (e.g., etched by plasma) to selectively expose the top surface the high conductive pillar 904b, and the short conductive pillar 904b is not exposed from the insulation layer 905. In FIG. 9F, a patterned conductive layer 907b is formed (e.g., by electroplating or deposition) using a photo resist layer 906b. In FIG. 9F, the conductive pillar 904b is selectively electrically coupled to the patterned conductive layer 907b. However, since the conductive pillar 904a is not electrically coupled to the patterned conductive layer 907b, the performance (e.g., inductance, Q value, and direct contact resistance) of the passive element 820 or 840 shown in FIG. 8A or 8B is adversely affected. For example, the inductance and Q value are much smaller than the specified values, and the direct contact resistance is much greater than the specified value. Moreover, the passive element 820 or 840 may not work because of the open circuit between the conductive pillar 904a and the patterned conductive layer 907b.

Figure 10B:
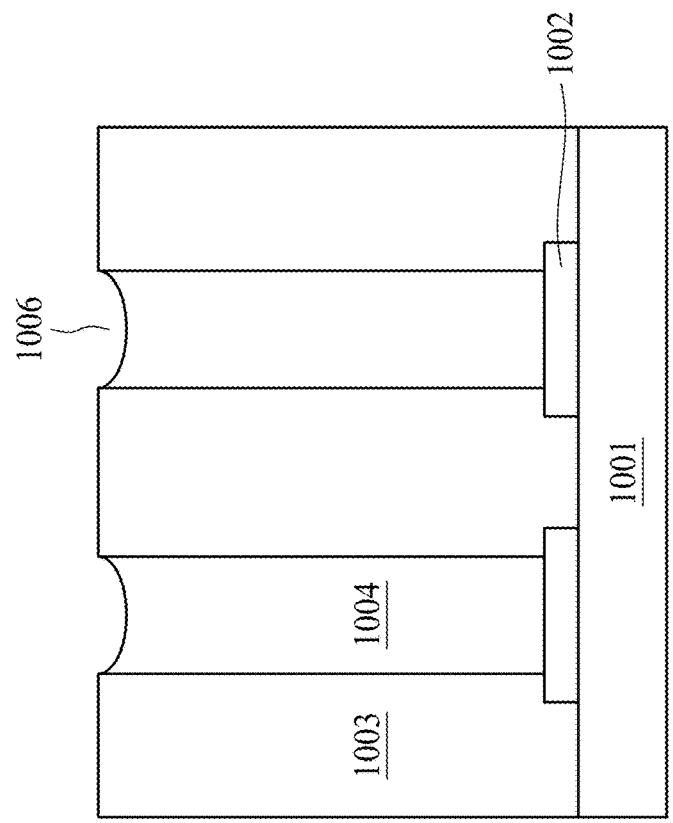
FIG. 10A, FIG. 10B, and FIG. 10C illustrate cross-sectional views showing the operations for forming conductive pillars corresponding to the semiconductor device shown in FIG. 8A or 8B according to some embodiments of the subject application.
Figure 10A:
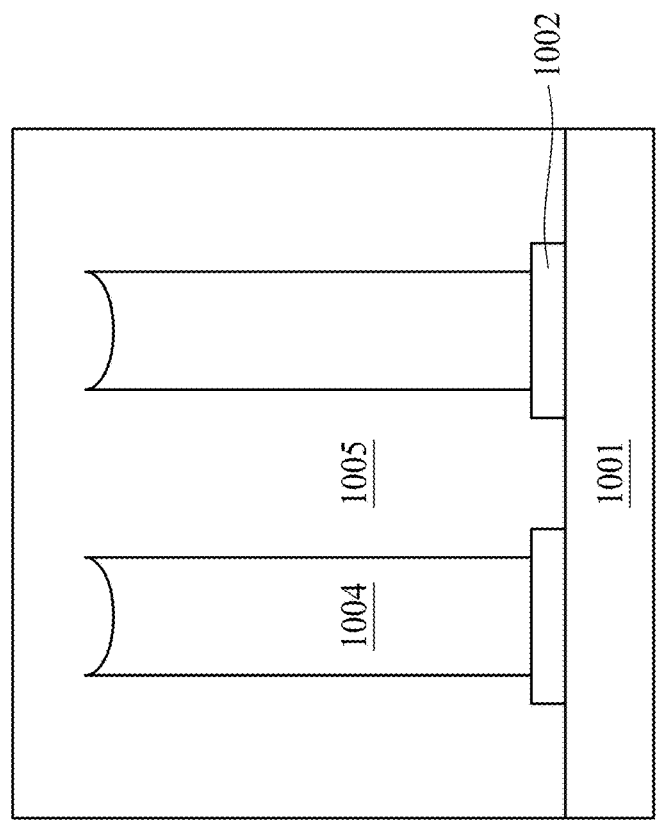
Figure 10D:
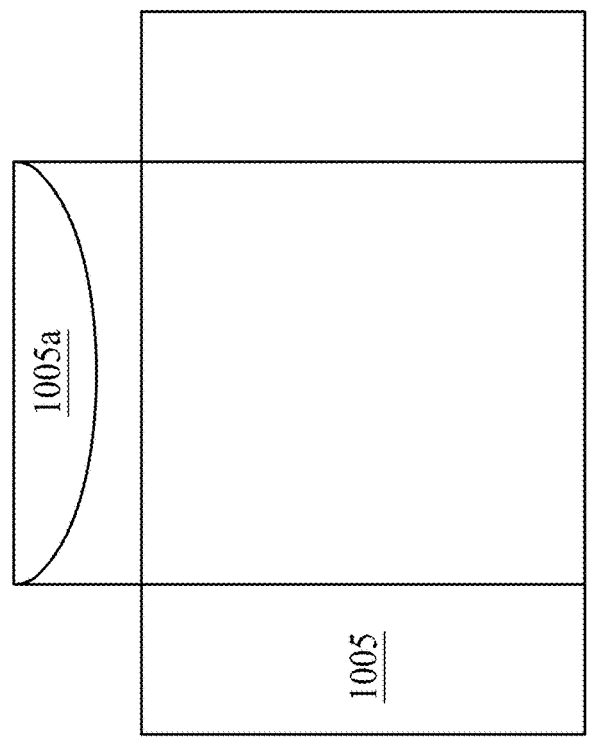
FIG. 10D illustrates a magnified view of the region E shown in FIG. 10C according to some embodiments of the subject application.
Figure 10C:
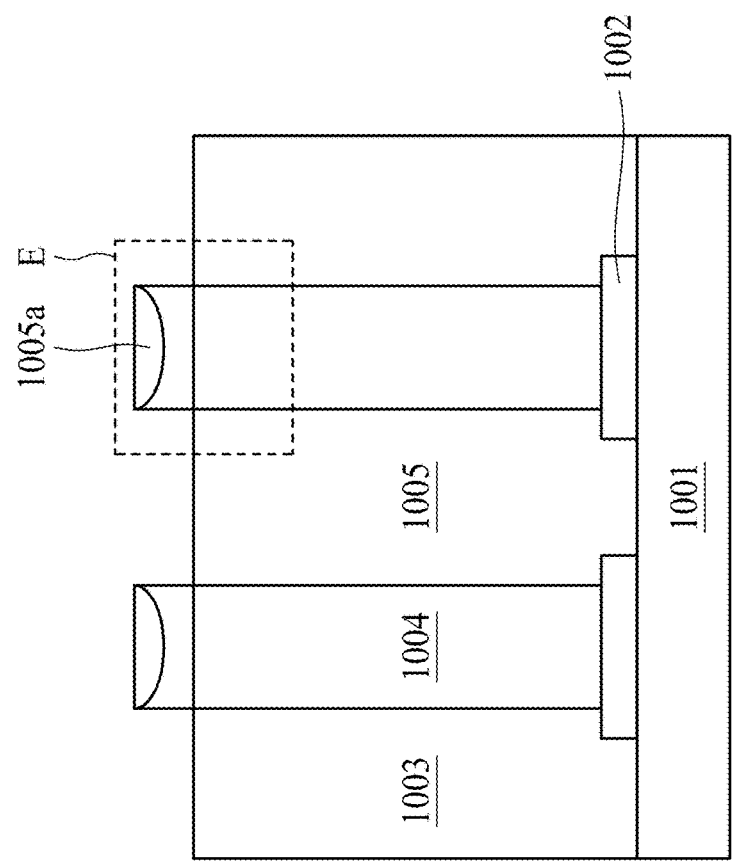

FIGS. 10A to 10C illustrate cross-sectional views showing the operations for forming conductive pillars of the semiconductor device 801 or 802 shown in FIG. 8A or 8B according to some embodiments of the subject application. In particular, FIGS. 10A to 10C illustrate cross-sectional views showing the operations for forming conductive pillars of the passive element 820 or 840 shown in FIG. 8A or 8B according to some embodiments of the subject application. In FIG. 10A, a patterned conductive layer 1002 and conductive pillars 1004 are formed (e.g., by electroplating or deposition) on a carrier 1001 using a photo resist layer 1003. Due to the characteristics of the electroplating or deposition of a conductive material (e.g., a metal), a bowl-shaped space 1006 is formed at the top of the conductive pillar 1004. A cross section of the top surface of the conductive pillars 1004 is a smile-like curve. In FIG. 10B, the photo resist layer 1003 is removed and an insulation layer 1005 is formed on the carrier 1001 such that the patterned conductive layer 1002 and the conductive pillars 1004 are encapsulated. In FIG. 10C, a portion of the insulation layer 1005 is removed (e.g., by plasma etching) such that the conductive pillars 1004 are exposed and protruded from the insulation layer 1005. Although the portion of the insulation layer 1005 is removed, some residue 1005a of the insulation layer 1005 remains in the bowl-shaped spaces 1006 of the conductive pillars 1004.

FIG. 10D illustrates a magnified view of the region E shown in FIG. 10C according to some embodiments of the subject application. FIG. 10D clearly shows the residue 1005a of the insulation layer 1005 in the bowl-shaped space of the conductive pillar 1004. If a patterned conductive layer is formed on the insulation layer 1005 and the conductive pillars 1004 (formed through the operations shown in FIG. 9D or 9F), the residue 1005a of the insulation layer 1005 will cause poor electrical conductivity or open circuit between the conductive pillar 1004 and a patterned conductive layer thereon. In this case, the performance (e.g., inductance, Q value, and direct contact resistance) of the passive element 820 or 840 shown in FIG. 8A or 8B is adversely affected. For example, the inductance and Q value are much smaller than the specified values, and the direct contact resistance is much greater than the specified value. Moreover, the passive element 820 or 840 may not work because of the open circuit.

While the disclosure has been described and illustrated with reference to specific embodiments thereof, these descriptions and illustrations do not limit the disclosure. It should be understood by those skilled in the art that various changes may be made and equivalents may be substituted without departing from the true spirit and scope of the disclosure as defined by the appended claims. The illustrations may not necessarily be drawn to scale. There may be distinctions between the artistic renditions in the subject application and the actual implementations, due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the disclosure. Accordingly, unless otherwise specifically indicated herein, the order and grouping of the operations are not limitations of the disclosure.

Moreover, the effects detailed in the above-described embodiments and the like are merely examples. Therefore, the subject application may further have other effects.

What is claimed is:

1. An electronic device, comprising:
   a first insulation layer having a first surface and a second surface opposite to the first surface; and
   a first conductive pillar comprising a first portion and a second portion,
   wherein the first portion of the first conductive pillar is surrounded by the first insulation layer, the second portion of the first conductive pillar is disposed on the first surface of the first insulation layer, a height of the second portion of the first conductive pillar is equal to or greater than 10% of a height of the first portion of the first conductive pillar, wherein the second portion of the first conductive pillar has a curved surface, and the curved surface surrounds the second portion of the first conductive pillar,
   wherein a width of the first portion of the first conductive pillar and a width of the second portion of the first conductive pillar has a first difference, and a ratio of the height of the second portion of the first conductive pillar to the first difference ranges from 1:1.1 to 1:1.3.

2. The electronic device of claim 1, wherein the first and second portions of the first conductive pillar are formed in one piece.

3. The electronic device of claim 1, wherein the height of the first portion of the first conductive pillar is equal to or greater than 140 µm.

4. The electronic device of claim 1, wherein the curved surface of the second portion of the first conductive pillar comprises a first point having a minimum height with respect to the first surface of the first insulation layer and a second point having a maximum height with respect to the first surface of the first insulation layer.

5. The electronic device of claim 4, wherein $$\left|\frac{\text{the maximum height of the second point} - \text{the minimum height of the first point}}{\text{the minimum height of the first point}}\right| \times 100\% \leq 0.5\%.$$

6. The electronic device of claim 1, wherein the curved surface of the second portion of the first conductive pillar comprises a convex surface.

7. The electronic device of claim 6 wherein a cross section of the second portion of the first conductive pillar defines a part of a circle or an ellipse.

8. The electronic device of claim 6, wherein the second portion of the first conductive pillar defines a recess.

9. The electronic device of claim 1, further comprising:
   a first patterned conductive layer surrounded by the first insulation layer and integrally formed with the first conductive pillar; and
   a second patterned conductive layer disposed on the second portion of the first conductive pillar, disposed on the first surface of the first insulation layer and electrically coupled to the first conductive pillar.

10. The electronic device of claim 9, wherein the second patterned conductive layer comprises two consecutive curved surfaces.

11. The electronic device of claim 10, wherein the second patterned conductive layer comprises a rim, and a part of the rim of the second patterned conductive layer is lower than a top surface of the second portion of the first conductive pillar.

12. The electronic device of claim 11, wherein the part of the rim of the second patterned conductive layer that is lower than the top surface of the second portion of the first conductive pillar is separated from the first conductive pillar by the first insulation layer.

13. The electronic device of claim 9, further comprising a seed layer disposed between the first conductive pillar and the second patterned conductive layer.

14. The electronic device of claim 1, further comprising a second conductive pillar, wherein the first portion of the first conductive pillar has a first height, a first portion of the second conductive pillar has a second height, $$\left|\frac{\text{the first height} - \text{the second height}}{\text{the first height} + \text{the second height}}\right| \times 100\% \leq 10\%.$$

15. The electronic device of claim 9, further comprising a redistribution layer, wherein the first insulation layer, the first conductive pillar, the first patterned conductive layer, the second patterned conductive layer, and the redistribution layer are formed in a substrate.

16. The electronic device of claim 1, further comprising a second conductive pillar, wherein a pitch between the first conductive pillar and the second conductive pillar is equal to or greater than the width of the second portion of the first conductive pillar.

17. The electronic device of claim 1, further comprising a second conductive pillar, wherein the first portion of the first conductive pillar has a first height, a first portion of the second conductive pillar has a second height, and $$\left|\frac{\text{the first height} - \text{the second height}}{(\text{the first height} + \text{the second height})/2}\right| \times 100\% \leq 10\%.$$

* * * * *